United States Patent [19]
Endoh et al.

[11] Patent Number: 5,323,117
[45] Date of Patent: Jun. 21, 1994

[54] METHOD FOR DETECTING PARTIAL DISCHARGE IN AN INSULATION OF AN ELECTRIC POWER APPARATUS

[75] Inventors: Takeshi Endoh; Tomoaki Imai; Mikio Hagiya; Chuki Ikeda, all of Ibaraki, Japan

[73] Assignee: Hitachi Cable, Ltd., Tokyo, Japan

[21] Appl. No.: 784,728

[22] Filed: Oct. 28, 1991

Related U.S. Application Data

[63] Continuation of Ser. No. 473,279, Jan. 31, 1990, abandoned.

[30] Foreign Application Priority Data

| Oct. 25, 1989 | [JP] | Japan | 1-277928 |
| Nov. 29, 1989 | [JP] | Japan | 1-309743 |
| Nov. 29, 1989 | [JP] | Japan | 1-309744 |
| Dec. 2, 1989 | [JP] | Japan | 1-314006 |

[51] Int. Cl.$^5$ .................................. G01B 31/08
[52] U.S. Cl. .................................. 324/551; 324/541; 324/544
[58] Field of Search ........ 324/541, 544, 536, 529–530, 324/527, 514, 551, 557

[56] References Cited

U.S. PATENT DOCUMENTS

| 2,792,568 | 5/1957 | Scott et al. | 324/544 |
| 2,832,042 | 4/1958 | Lambert | 324/544 |
| 3,252,085 | 5/1966 | Whitekettle, Jr. | 324/536 X |
| 3,346,808 | 10/1967 | Bader | 324/544 |
| 3,370,227 | 2/1968 | Bader et al. | 324/536 X |
| 3,869,665 | 3/1975 | Kenmochi et al. | 324/536 X |
| 4,001,674 | 1/1977 | Schneider | 324/544 |
| 4,064,454 | 12/1977 | Yoshino et al. | |
| 4,134,061 | 9/1979 | Godgel | |
| 4,446,420 | 5/1984 | Drouet | 324/529 X |
| 4,789,829 | 12/1988 | Stribling | |
| 4,853,616 | 8/1989 | Gard | 324/551 |
| 4,882,682 | 11/1989 | Takasuka et al. | 324/536 X |
| 4,887,041 | 12/1989 | Mashikian et al. | 324/541 |
| 4,897,607 | 1/1990 | Grünewald et al. | 324/536 X |
| 4,929,903 | 5/1990 | Saigo et al. | 324/536 X |
| 4,967,158 | 10/1990 | Gonzalez | 324/536 |

FOREIGN PATENT DOCUMENTS

| 147822 | 7/1985 | European Pat. Off. |
| 182488 | 5/1986 | European Pat. Off. |
| 0182488 | 5/1986 | European Pat. Off. |
| 3610170 | 10/1987 | Fed. Rep. of Germany |
| 3802841 | 8/1989 | Fed. Rep. of Germany |
| 56-157873 | 12/1981 | Japan |
| 57-189074 | 11/1982 | Japan |
| 62011177 | 7/1985 | Japan |
| 8801748 | 3/1988 | World Int. Prop. O. |

OTHER PUBLICATIONS

358 I.S.A. Transactions, vol. 21, 1982, "Phase Noise Measurement Systems" by Lance et al. (no month).

Primary Examiner—Kenneth A. Wieder
Assistant Examiner—Christopher Tobin
Attorney, Agent, or Firm—Helgott & Karas

[57] ABSTRACT

In an electric apparatus such as an electric power cable system, a high frequency pulse is induced on a conductive member such as a metal sheath, where partial discharge occurs in an insulation. The high frequency pulse is detected by means of a bypass lead wire, a metal foil electrode, a detecting coil, and the like provided on the electric apparatus without interrupting a live operation of the electric apparatus.

8 Claims, 28 Drawing Sheets

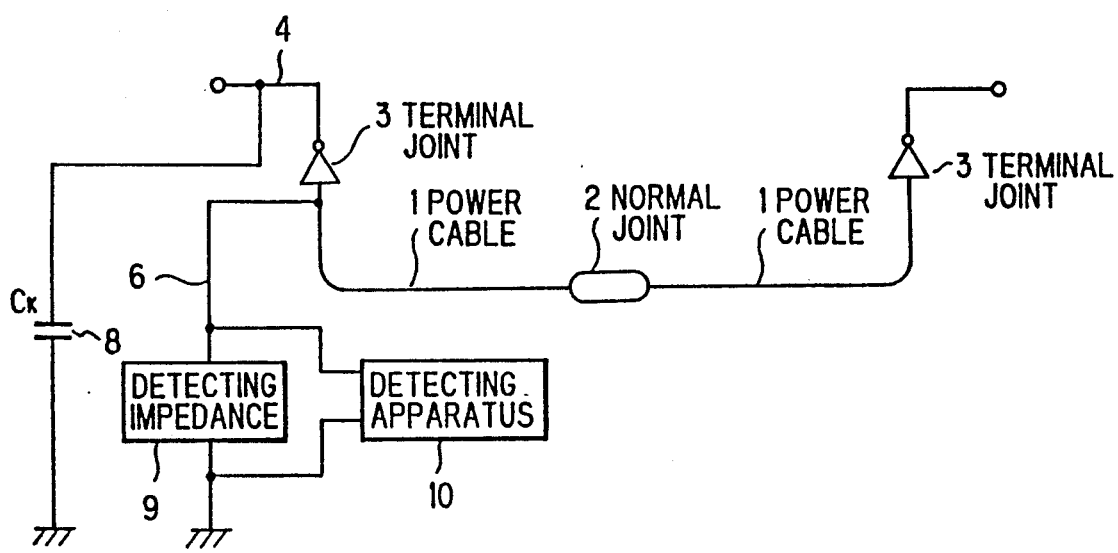
FIG. IA PRIOR ART

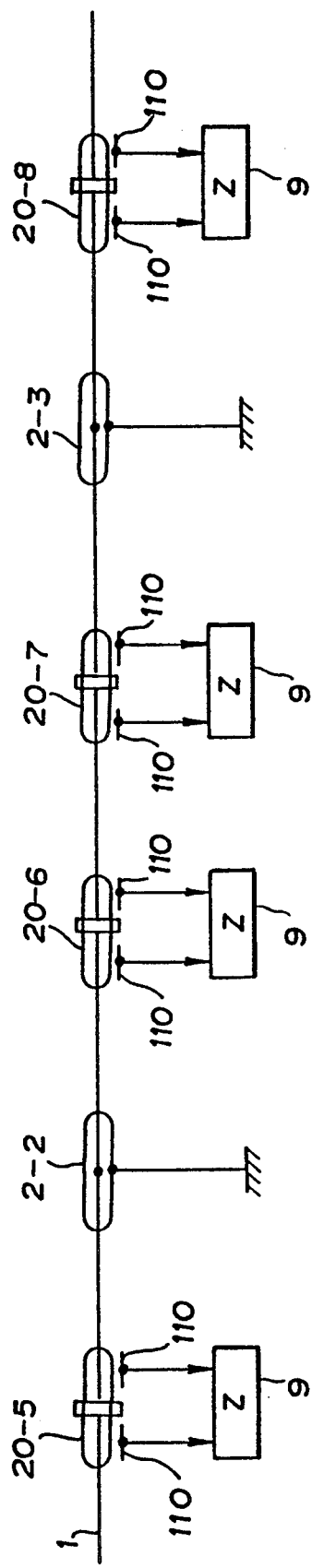

METHOD FOR DETECTING PARTIAL DISCHARGE IN AN INSULATION OF AN ELECTRIC POWER APPARATUS

This is a continuation, of application Ser. No. 473,279, filed Jan. 31, 1990, now abandoned.

FIELD OF THE INVENTION

This invention relates to a method for detecting partial discharge in an insulation of an electric power apparatus, and more particularly to a method for detecting partial discharge in an insulation of an electric power cable, and the like to diagnose the deterioration of the insulation.

BACKGROUND OF THE INVENTION

An electric power cable system comprises a plurality of electric power cables which are connected to provide power cable lines by normal joints, insulating joints, etc., wherein the power cable lines are connected through terminal joints at both ends to high voltage conductors. Each of the power cables comprises, for instance, an electric conductor, an inner semi-conductive layer provided around the electric conductor, an insulation provided around the semi-conductive layer to insulate the electric conductor, an outer semi-conductive layer provided around the insulation, a metal sheath provided around the outer semi-conductive layer, and an anti-corrosion layer of poly-vinyl chloride provided around the metal sheath. In this power cable system, the metal sheath is connected, typically, at the normal joints, the terminal joints, etc. to the ground by lead wires.

In detecting partial discharge in the insulation of the power cable, a high voltage applied to the power cable system is turned off to stop operation thereof, and a detecting impedance is inserted into a selected one of the lead wires connecting the metal sheaths to the ground. Furthermore, an apparatus for detecting the partial discharge is connected to both terminals of the detecting impedance. Then, a predetermined high voltage is applied to the electric conductor of the power cable, so that the partial discharge occurs at deteriorating or defect portions of the insulation, thereby generating a high frequency pulse therein. This high frequency pulse induces a high frequency current flowing through the lead wire, so that an electric potential difference is generated across the both terminals of the detecting impedance. The electric potential difference is detected in the partial discharge detecting apparatus to diagnose the deterioration of the insulation.

In the other method for detecting the partial discharge in the insulation of the power cable, the detecting impedance is inserted between a coupling capacitor, which is connected to the high voltage conductor connected through the terminal joint to the electric conductor of the power cable, and the ground, and the apparatus for detecting the partial discharge is connected to the both terminals of the detecting impedance. The partial discharge is detected in the same manner as described in the former method.

However, the conventional method for detecting partial discharge in an insulation of an electric power cable has a first disadvantage in that the reliance of the electric power cable system is lowered, because the selected lead wire is removed to insert the detecting impedance between the metal sheath and the ground, and an original state is restored, after the partial discharge detecting procedure is over. Furthermore, second and third disadvantages are observed in that operation of the power cable system is interrupted as described before, and in that the detecting operation is troublesome, because the insertion of the coupling capacitor is inevitable. In addition, there is a fourth disadvantage in that the high frequency pulse is attenuated to be propagated to the coupling capacitor in the latter method, and the coupling capacitor must withstand a high voltage. More additionally, fifth to seventh disadvantages are found in that a high detecting sensitivity of the high frequency pulse is not obtained, because the power cable is exposed to external noise, and an overall capacitance of the power cable is large, in that a S/N ratio is lowered, where a measuring frequency is coincident with a frequency at which a noise level is high, and in that a calibration of the apparatus for detecting the partial discharge is difficult in operation, where the partial discharge is detected at the normal joints, the insulating joints, the cable insulation, etc. which are remote from the terminal joints, because a calibration pulse is applied to the high voltage conductor connected to the electric conductor of the power cable.

SUMMARY OF THE INVENTION

Accordingly, it is a first object of the invention to provide a method for detecting partial discharge in an insulation of an electric power apparatus, by which the reliance of the electric power cable apparatus is not deteriorated.

It is a second object of the invention to provide a method for detecting partial discharge in an insulation of an electric power apparatus which is carried out without interrupting operation of the electric power apparatus.

It is a third object of the invention to provide a method for detecting partial discharge in an insulation of an electric power apparatus in which the detecting operation is simple.

It is a fourth object of the invention to provide a method for detecting partial discharge in an insulation of an electric power apparatus in which the attenuation of a high frequency pulse is avoided, and an additional device such as a coupling capacitor is not required to be provided.

It is a fifth object of the invention to provide a method for detecting partial discharge in an insulation of an electric power apparatus in which a detecting sensitivity of a high frequency pulse is high.

It is a sixth object of the invention to provide a method for detecting partial discharge in an insulation of an electric power apparatus in which a S/N ratio is improved.

It is a seventh object of the invention to provide a method for detecting partial discharge in an insulation of an electric power apparatus in a calibration of an apparatus for detecting the partial discharge is easy.

According to the invention, a method for detecting partial discharge in an insulation of an electric apparatus, comprises:

providing a magnetic core having a predetermined inductance around a lead wire, through which a high frequency pulse induced by the partial discharge flows;

connecting a detecting lead wire in parallel to the lead wire, the high frequency pulse thereby being bypassed through the detecting lead wire; and detecting the high frequency pulse flowing through the detecting lead wire to diagnose a degradation of the insulation.

According to a further feature of the invention, a method for detecting partial discharge in an insulation of an electric apparatus, comprises:

providing a detecting electrode for a capacitive coupling on a conductive member, on which a high frequency pulse is induced by the partial discharge, to provide a capacitor; and introducing the high frequency pulse through the detecting electrode to a partial discharge detecting apparatus, in which the partial discharge is detected to diagnose a degradation of the insulation.

These and other features of the invention will be apparent in following descriptions of preferred embodiments.

BRIEF DESCRIPTION OF THE DRAWINGS

The 1A to 1C are explanatory diagrams showing conventional methods for detecting partial discharge in an insulation of an electric apparatus.

FIGS. 36A and 36B are explanatory diagram and a graph indicating a signal intensity for location of partical discharge in a method for detecting partial discharge in an insulation of an electric apparatus in a eighteenth preferred embodiment according to the invention.

DETAILED DESCRIPTION OF THE PREFERRED EMBODIMENTS

Before explaining a method for detecting partial discharge an insulation of an electric power apparatus in a preferred embodiment according to the invention, the aforementioned conventional methods for detecting partial discharge will be explained.

Figure 1B:
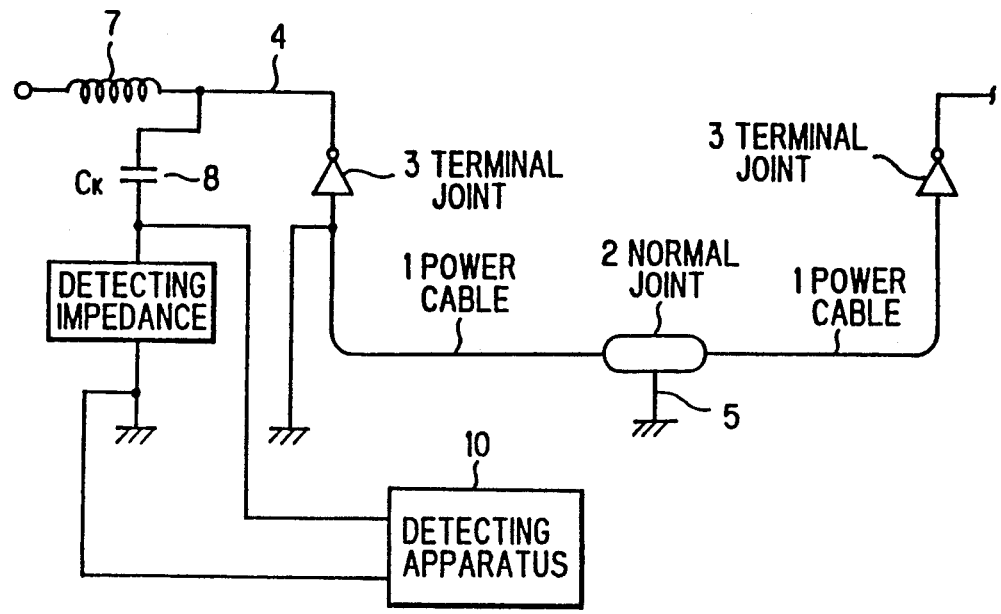
Figure 1C:
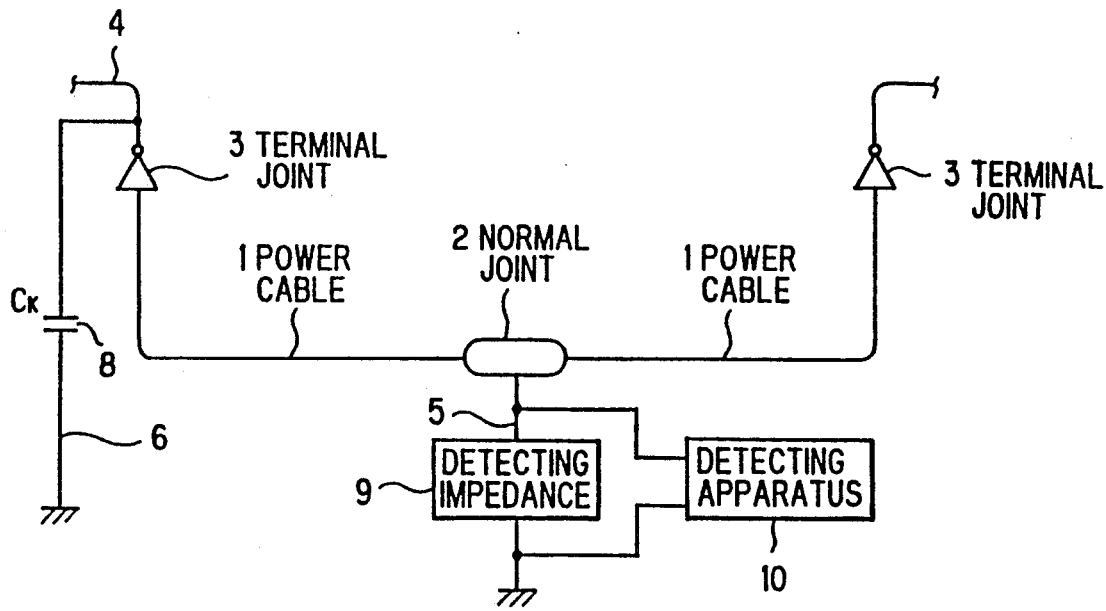

FIGS. 1A to 1C show an electric power cable line, to which the conventional methods for detecting partial discharge in an insulation of a power cable, comprising power cables 1 which are connected to each other by a normal joint 2, and each of which is connected to a high voltage conductor 4 by a terminal joint 3. Metal sheaths (not shown) of the power cables 1 are connected at the normal joint 2 and the terminal joint 3 to the ground by lead wires 5 and 6, respectively.

In FIG. 1A, a detecting impedance 9 is inserted between the metal sheath and the ground by use of the lead wire 6 connected to the terminal joint 3, and an apparatus 10 for detecting partial discharge is connected to both terminals of the detecting impedance 9. In addition, a coupling capacitor 8 is connected between the high voltage conductor 4 and the ground, thereby providing a closed circuit for the partial discharge detection.

In FIG. 1B, a coupling capacitor 8 is provided be connected at one electrode to the high voltage conductor 4 and at the other electrode to the detecting impedance 9, and a choke coil 7 is provided to stop a high frequency pulse to be passed therethrough and allow the high frequency pulse to be passed through the coupling capacitor 8. As a matter of course, the partial discharge detecting apparatus 10 is connected to the both terminals of the detecting impedance.

In FIG. 1C, the detecting impedance 9 is inserted between the metal sheath and the ground by use of the lead wire 5 connected to the normal joint 2, and is connected at the both terminals to the partial discharge detecting apparatus 10.

In operation, a predetermined high voltage is applied to the high voltage conductor 4. Where partial discharge occurs in the insulation of the power cable 1, especially at the normal and terminal joints 5 and 3, a high frequency pulse is induced between the electric conductor and the metal sheath, so that an electric potential difference is generated across the both terminals of the detecting impedance 9 in accordance with the flowing of a high frequency current through the detecting impedance 9 from the metal sheath to the ground. The electric potential difference is detected by the apparatus 10, so that the deterioration of the insulation is diagnosed in the apparatus 10.

Next, the calibration of the partial discharge detecting apparatus 10 will be explained in FIG. 2A, wherein like parts are indicated by like reference numerals as used in FIG. 1C, except that a calibration signal generator 11 is connected to the high voltage conductor 4 and the metal sheath of the terminal joint 3, and a coupling capacitor 8 of a capacitance $C_K$ is connected between the high voltage conductor 4 and the ground.

Figure 2A:
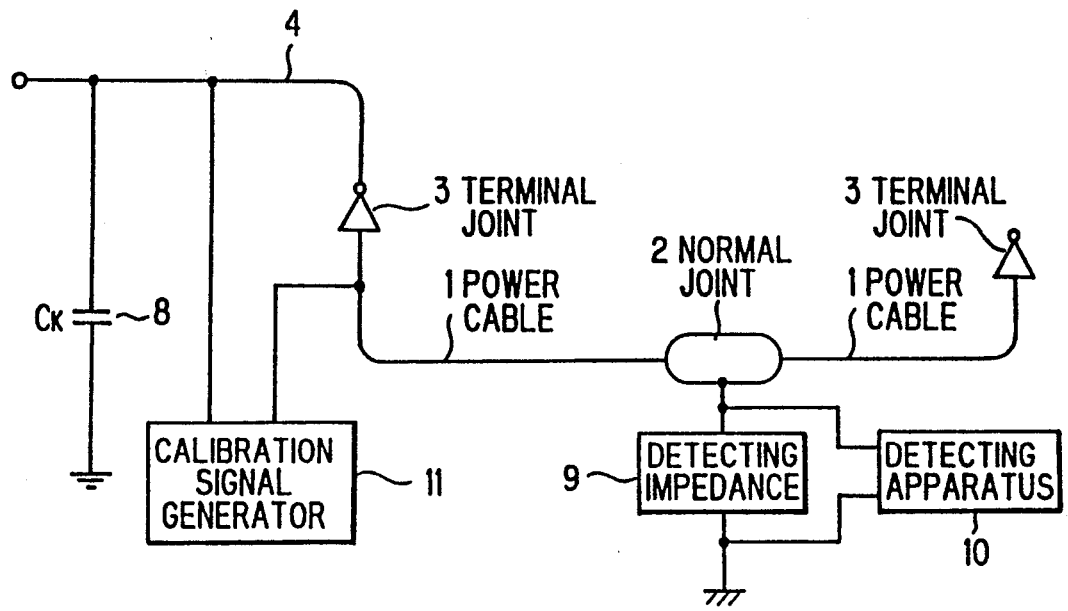
FIGS. 2A and 2B are an explanatory diagram and an equivalent circuit for calibrating operation in a conventional method for detecting partial discharge in an insulation of an electric apparatus.
Figure 2B:
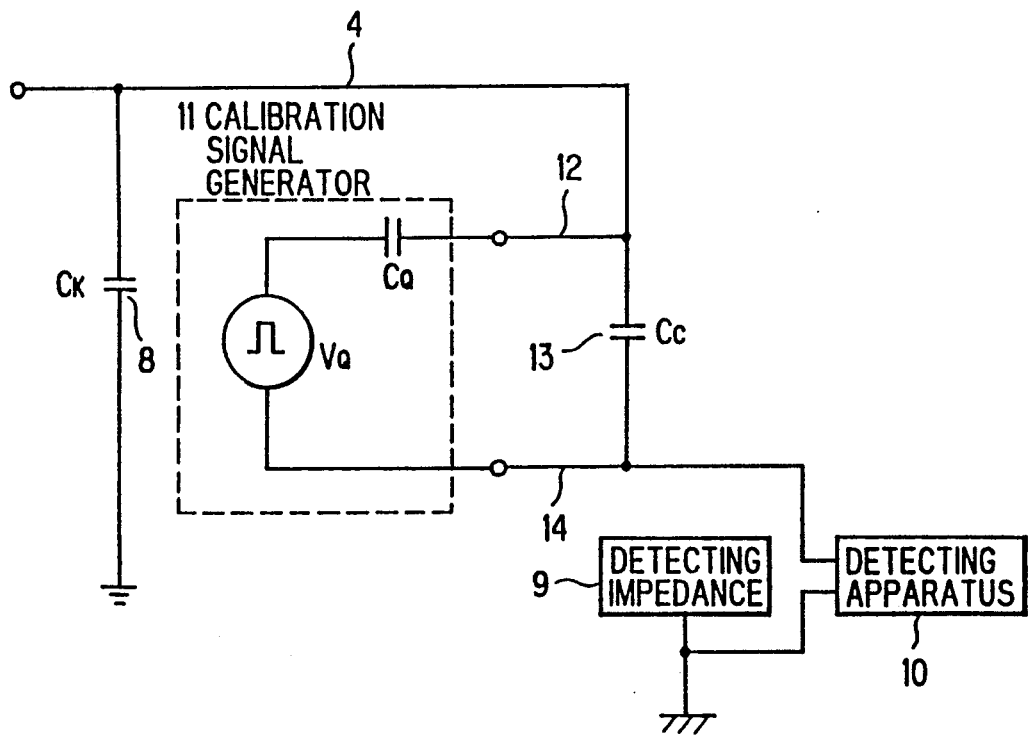

FIG. 2B shows an equivalent circuit corresponding to the construction of FIG. 2A. In FIG. 2B, the calibration signal generator 11 supplies a high frequency pulse having a voltage $V_Q$ through a capacitor of a capacitance $C_Q$ across the conductor 12 and the metal sheath 14 of the power cable 1, between which a capacitor 13 of a capacitance $C_C$ is formed. Thus, the high frequency pulse flowing through the capacitor 13 is partially shunted into the detecting impedance 9, so that an electric potential difference is generated across both terminals of the detecting impedance 9. Then, the sensitivity calibration of the partial discharge detecting apparatus 10 is carried out.

Here, if it is assumed that an apparent charge of discharge which is carried out by the capacitor 13 is Q, and an electric potential difference across the capacitor 13 is $V_1$, the equation (1) obtained $$Q = V_Q \cdot C_Q = V_1 \cdot C_C \quad (1)$$

From the equation (1), the equation (2) is obtained.

$$V_1 = \frac{C_Q}{C_C} \cdot V_Q \quad (2)$$

In an actual power cable system, a length of a power cable line is, for instance, several Km, so that the capacitance $C_C$ is much greater than the capacitance $C_Q$ ($C_C > C_Q$). Consequently, the voltage $V_1$ becomes very small, so that the calibration of the partial discharge detecting apparatus 10 is difficult in operation to be carried out. In other words, the high frequency pulse $V_Q$ is attenuated to reach the normal joint 2, at which the partial discharge detecting apparatus 10 is located to be connected across the detecting impedance 9.

In the explanation of the methods for detecting partial discharge in the insulation of the power cable system, frequency dependency of noise which has been confirmed by the inventors will be finally explained.

In the detection of the noise frequency dependency, the method as shown in FIG. 1B is used, wherein a length of the power cables 1 is 10 Km, and the partial discharge detecting apparatus 10 is of a frequency-sweep type signal intensity detector.

Figure 3A:
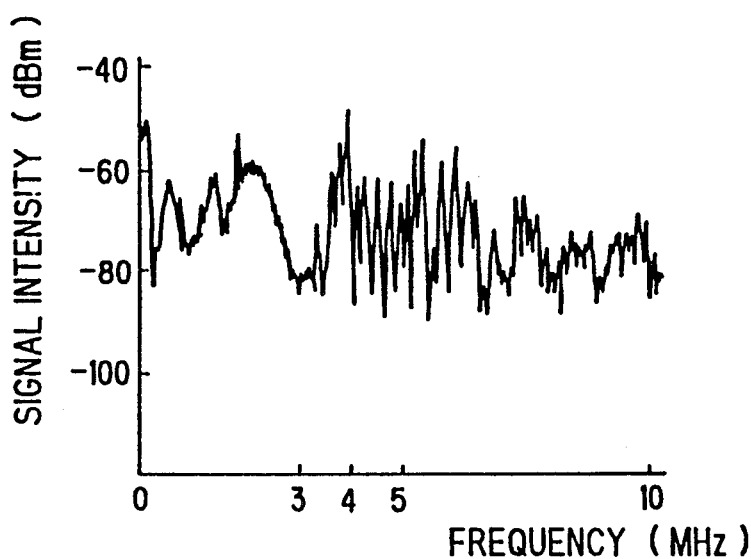
FIGS. 3A to 3C are a frequency spectrum of noise obtained from an electric power cable.
Figure 3B:
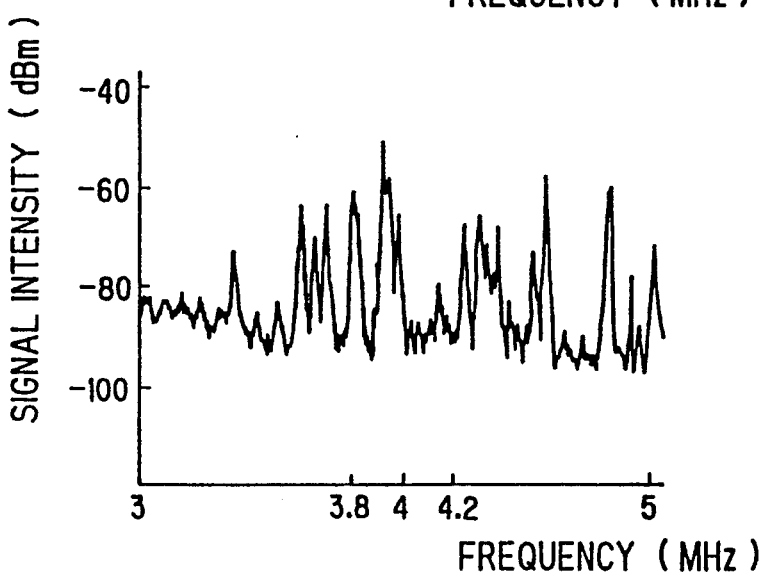
Figure 3C:
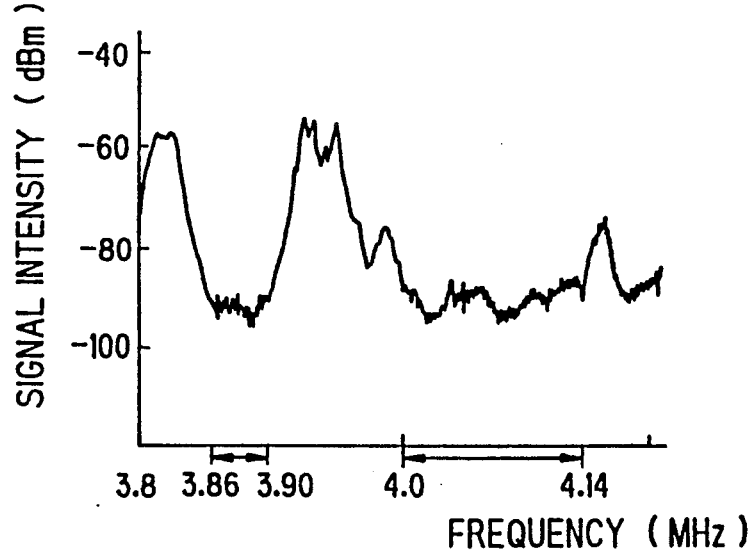

FIGS. 3A to 3C show a frequency spectrum of noise which is received by the apparatus 10, where no voltage is applied to the conductors of the power cables 1. As clearly illustrated, FIG. 3A shows the frequency spectrum ranging up to 10 MHz which is characterized by having a high level of noise in the vicinity of 4 MHz, and FIGS. 3B and 3C show enlarged frequency spectrums which cover ranges of 3 to 5 MHz and 3.8 to 4.2 MHz, respectively. As shown, especially, in FIG. 3C, noise is high in its level at 3.82 MHz, and 3.92 to 3.95 MHz, and low at 3.88 MHz, and 4.0 to 4.14 MHz. It should be noted that the noise level is lower at 3.88 MHz than at 3.82 MHz by approximately 35 dB.

The inventors have confirmed that partial discharge according in an insulation of an electric power cable is also of a frequency spectrum similar to that as described above, because:

(1) a circuit structure of an electric power cable system is complicated to have a number of inductance and capacitance components, by which resonance and anti-resonance are generated at various frequencies, so that an amplitude of a signal is complicatedly varied dependent on a frequency of the signal; and (2) a high frequency pulse is reflected to go forward and back along an electric power cable line in accordance with the mismatching of impedance, thereby generating a standing wave, so that a high detecting sensitivity is obtained, where a peak point of the standing wave is positioned at a detecting location, while a low detecting sensitivity is obtained, where a nodal point of the standing wave is positioned at the detecting location.

Now, a method for detecting partial discharge in an insulation of an electric power apparatus in a first preferred embodiment according to the invention will be explained.

Figure 4:
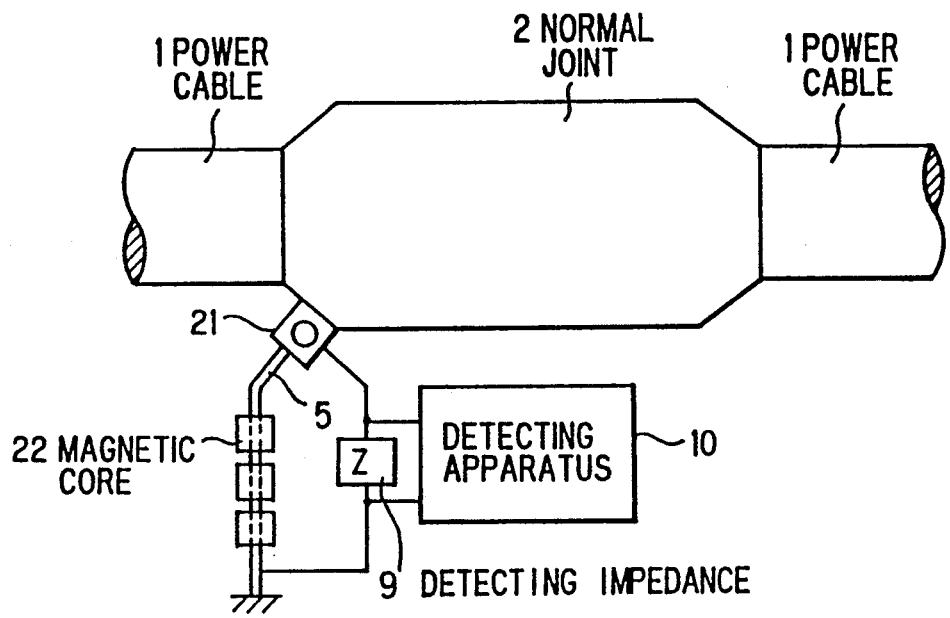
FIG. 4 is an explanatory view showing a method for detecting partial discharge in an insulation of an electric power cable in a first preferred embodiment according to the invention.

In FIG. 4, electric power cables 1 are connected to each other by a normal joint 2. The normal joint 2 is provided with a grounding terminal 21 for connecting metal sheaths of the power cables 1 and the normal joint 2 to the ground by a lead wire 5, around which a plurality of steel cores 22 are provided to increase an impedance of the lead wire 5. A partial discharge detecting apparatus 10 is connected to the grounding terminal 21 and a grounding end of the lead wire 5.

In operation, it is not necessary to turn a rated high voltage applied to electric conductors of the power cables 1 off. In other words, the power cables 1 remain in the state of live. Where partial discharge occurs, for instance, in an insulation of the normal joint 2, a high frequency pulse is induced between the electric conductor and the metal sheath of the normal joint 2, so that the high frequency pulse flows through the lead wire 5 from the grounding terminal 21 to the ground, thereby generating an electric potential difference across input terminals of the partial discharge detecting apparatus 10. In other words, almost all of the high frequency pulse flows through the partial discharge detecting apparatus 10 due to the increased impedance of the lead wire 5. Thus, the partial discharge is detected by the apparatus 10. In this preferred embodiment, a lead wire having a detecting impedance may be connected in parallel to the lead wire 5 having the steel cores 22, so that an electric potential difference across the detecting impedance can be detected by the apparatus 10.

Figure 5:
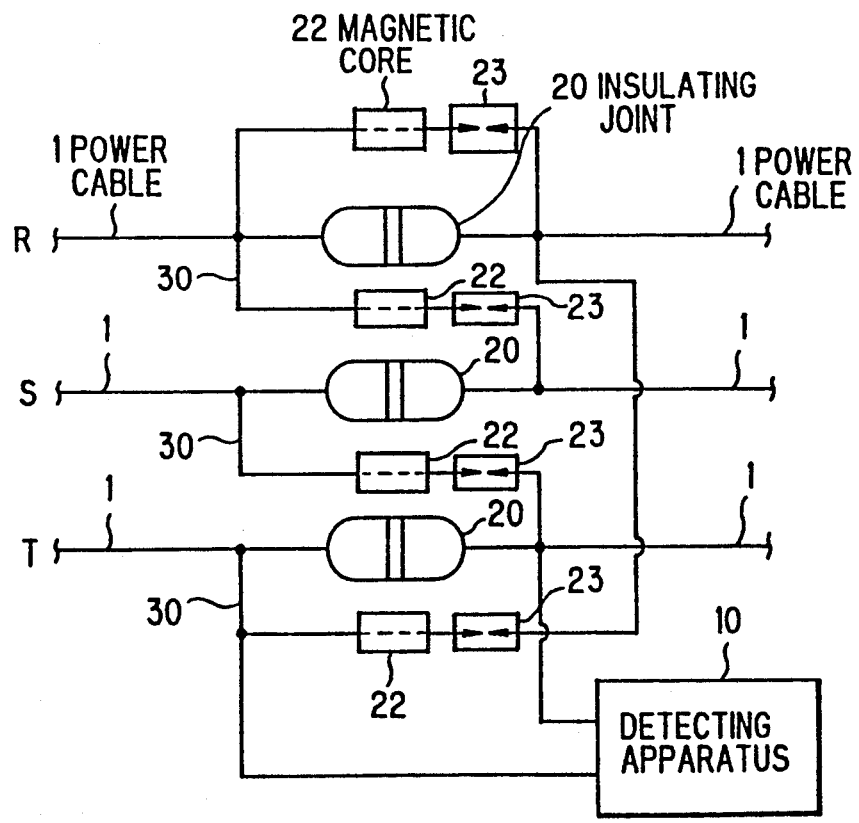
FIG. 5 is an explanatory diagram showing a method for detecting partial discharge in an insulation of an electric apparatus in a second preferred embodiment according to the invention.

FIG. 5 shows a method for detecting partial discharge in an insulation of an electric power apparatus in a second preferred embodiment according to the invention, wherein electric power cables 1 are connected to each other in each of R, S and T phases by an insulating joint 20, and metal sheaths of each insulating joint 20 are connected to cross between the adjacent phases by cross-bonding wires 30 each having a magnetic core 22 therearound. In the phase R, an arrester 23 is provided between the metal sheaths of the insulating joint 20 to protect an insulting portion of the insulating joint 20 from a surge voltage. For the purpose of detecting partial discharge in the phase T, a partial discharge detecting apparatus 10 is connected across the metal sheaths of the insulating joint 20 in the phase T.

In operation, a high frequency impedance of the cross-bonding wires 30 is increased in the provision of the steel cores 22, so that almost all of a high frequency pulse flows through the partial discharge detecting apparatus 10, where partial discharge occurs in the insulation of the insulating joint 20 of the phase T.

In the first and second preferred embodiments, the magnetic core 22 is preferably of a two-divided circular shape which can be attached around the lead wire 5 or the cross-bonding wire 30, for instance, by a snap operation. Although the magnetic core 22 is attached to the lead wire 5 (FIG. 4) and the cross-bonding wire 30 (FIG. 5), it may be attached to a jumper wire, etc. Furthermore, it may be attached to a grounding wire of an electric motor, a transformer, a switch, etc., and it may be applied to a communication system, in which a metal sheath is used as a communication medium for propagating a carrier signal, wherein transmitting and receiving apparatus are provided in place of the partial discharge detecting apparatus 10.

Figure 6:
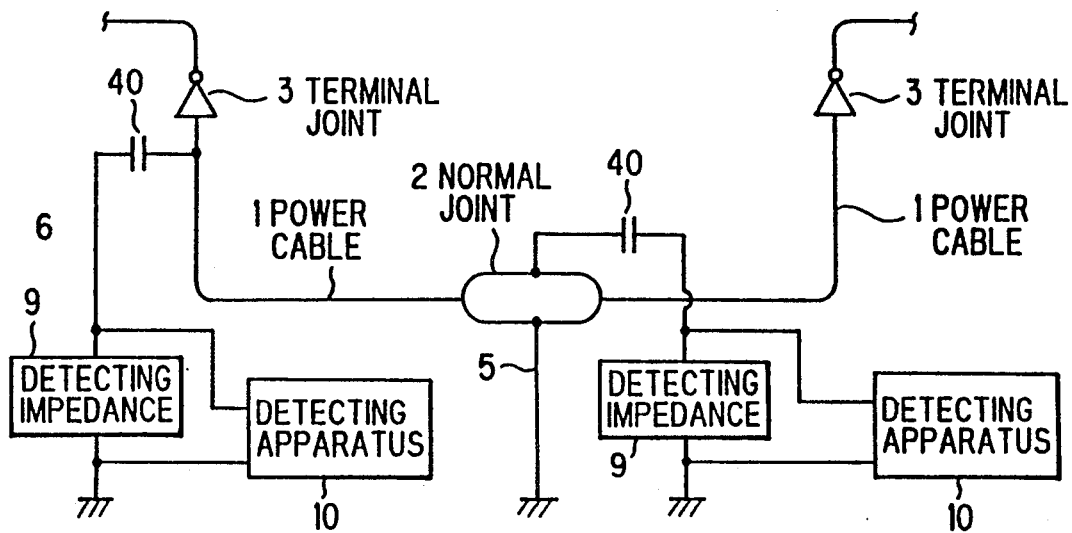
FIG. 6 is an explanatory diagram showing a method for detecting partial discharge in an insulation of an electric apparatus in a third embodiment according to the invention.

FIG. 6 shows a method for detecting partial discharge in an insulation of an electric power apparatus in a third preferred embodiment according to the invention, wherein like parts are indicated by like reference numerals as used in FIGS. 1A to 1C, except that detecting capacitors 40 are connected at one electrode to metal sheaths of the normal joint 2 and the terminal joint 3 and at the other electrode to the detecting impedances 9. Each one of the detecting impedances 9 and the detecting apparatus 10 may be provided at one of the terminal joint 3 and the normal joint 2.

Figure 7:
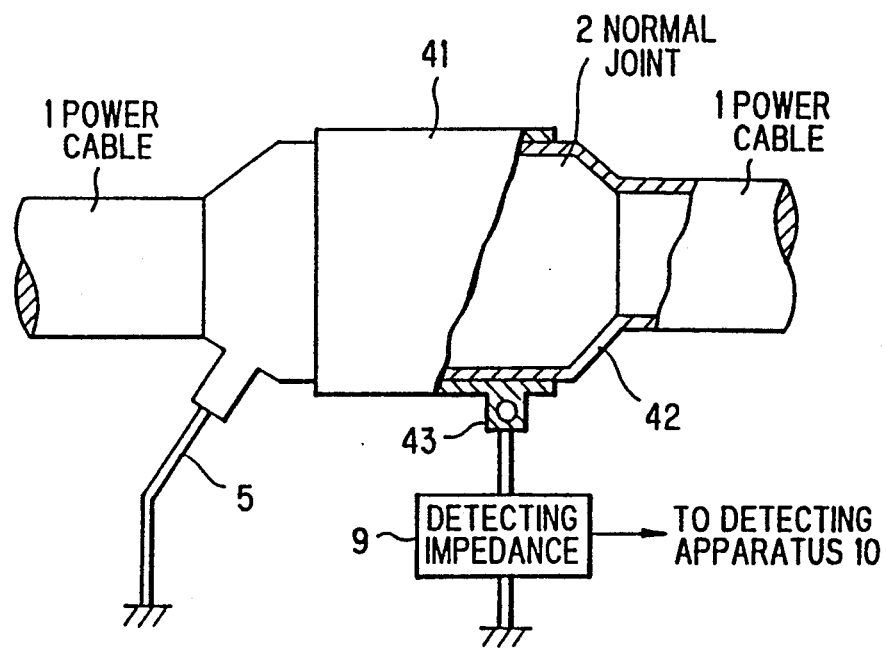
FIG. 7 is an explanatory view showing a normal joint in the third preferred embodiment.

In more detail, the detecting capacitor 40 is provided around the normal joint 2, such that a planar electrode 41 of, for instance, copper, aluminum, etc. surrounds the outer surface of a poly-vinyl chloride sheath 42 of the normal joint 2, as shown in FIG. 7. The planar electrode 41 is provided with a connecting terminal 43, to which the detecting impedance 9 is connected by use of a lead wire. As explained before, the metal sheath of the normal joint 2 is connected to the ground by the lead wire 5, and the both terminals of the detecting impedance 9 is connected to the partial discharge detecting apparatus 10. A size (area) of the planar electrode 41 is determined dependent on a frequency band of a high frequency pulse, a value of the detecting impedance 9, etc. by considering a reactance value of the detecting capacitor 40 not to be large. There is a residual inductance of a very small value between the grounding wire 5 and the detecting impedance 9, so that a voltage drop across the residual inductance can be detected.

Figure 8:
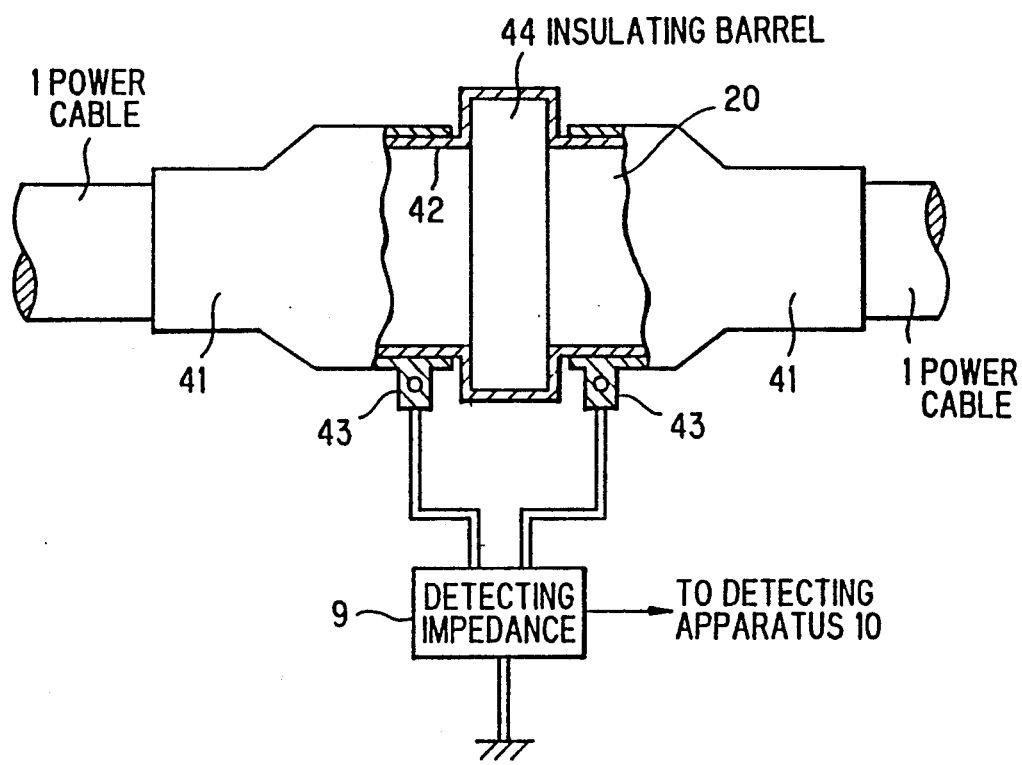
FIG. 8 is an explanatory view showing an insulating joint in a method for detecting partial discharge in an insulation of an electric apparatus in a fourth preferred embodiment according to the invention.

FIG. 8 shows a method for detecting partial discharge in an insulation of an electric power apparatus in a fourth preferred embodiment according to the invention, wherein a pair of planar electrodes 41 are provided on a poly-vinyl chloride sheath 42 of the insulating joint 20 having an insulating cylindrical member 41. The planar electrodes 41 are provided with connecting terminals 43, respectively, to which the detecting impedance 9 is connected by use of two lead wires. In the detecting impedance 9, the two lead wires are differentially connected to provide a middle point which is connected to the ground. The grounding may be omitted.

In operation, an electric potential generated in accordance with a difference of electric potentials on the metal sheaths on the both sides of the insulating cylindrical member 44 is applied to the detecting impedance 9, to which the partial discharge detecting apparatus 10 is connected. The detecting impedance 9 may be replaced by a pair of detecting impedances each connected to a corresponding one of the planar electrodes 41.

In the third and fourth preferred embodiments, modifications may be made as stated below.

(1) The planar electrode may be provided around the grounding lead wire. For instance, if the grounding lead wire is of a coaxial cable, an inner conductor can be a grounding lead wire, and an outer conductor can be a planar electrode.

(2) The planar electrode may be provided in a ring-shape around a grounding metal member of a terminal joint.

(3) The planar electrode may be replaced by an insulated metal member provided on a grounding side of a bushing for a terminal joint.

(4) The planar electrode may be reinforced on its outer and/or inner surfaces electrically and mechanically by adhering a vinyl tape, etc. thereto.

(5) The planar electrode may be composed of a metallized paper, etc.

(6) The planar electrode may be provided permanently, or temporarily, only when the partial discharge detection is carried out.

Figure 9:
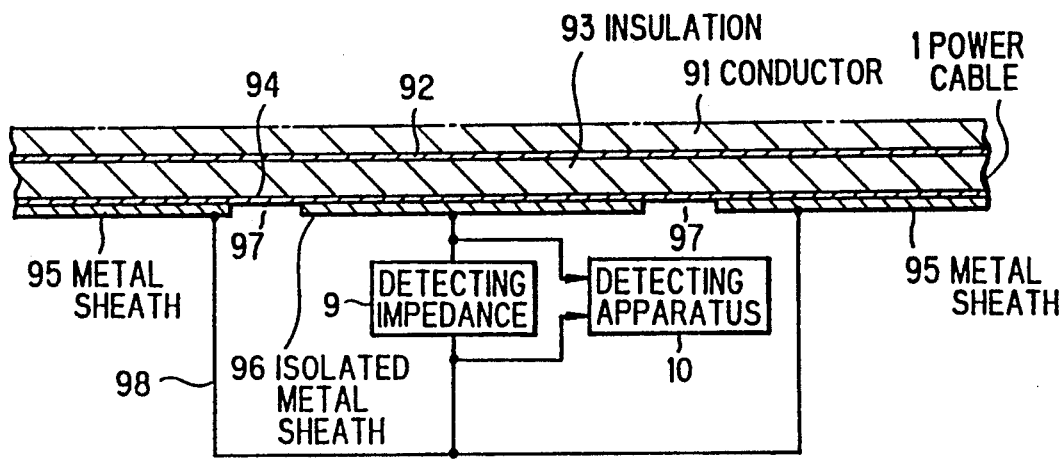
FIGS. 9, 10, 11 and 12 show methods for detecting partial discharge in an insulation of an electric apparatus in fifth to eighth preferred embodiments according to the invention.

FIG. 9 shows a method for detecting partial discharge in an insulation of an electric power apparatus in a fifth preferred embodiment according to the invention. In FIG. 9, an electric power cable 1 comprises a copper electric conductor 91, an inner semi-conductive layer 92 including conductive carbon, a cross-linked polyethylene insulation 93, an outer semiconductive layer 94 including conductive carbon, and an aluminum metal sheath 95. In the power cable 1, the metal sheath 95 is partially removed as indicated by reference numerals 97, thereby providing an isolated metal sheath 96 functioning as a detecting electrode. As a result, a detecting capacitor is formed by the isolated sheath 96 and the conductor 91 sandwiching the insulation 93 therebetween. The detecting impedance 9 is connected at one terminal to the isolated sheath 96, and at the other terminal to the metal sheath 95 by jumper wire 98, and the partial discharge detecting apparatus 10 is connected to the both terminals of the detecting impedance 9.

In operation, it is assumed that partial discharge occurs in the insulation 93 between the isolated sheath 96 and a corresponding region of the conductor 91. Thus, a partial discharge signal which is a high frequency signal flows through the detecting impedance 9, so that the high frequency signal is detected in the partial discharge detecting apparatus 10 in accordance with a voltage generated across the detecting impedance 9.

Figure 10:
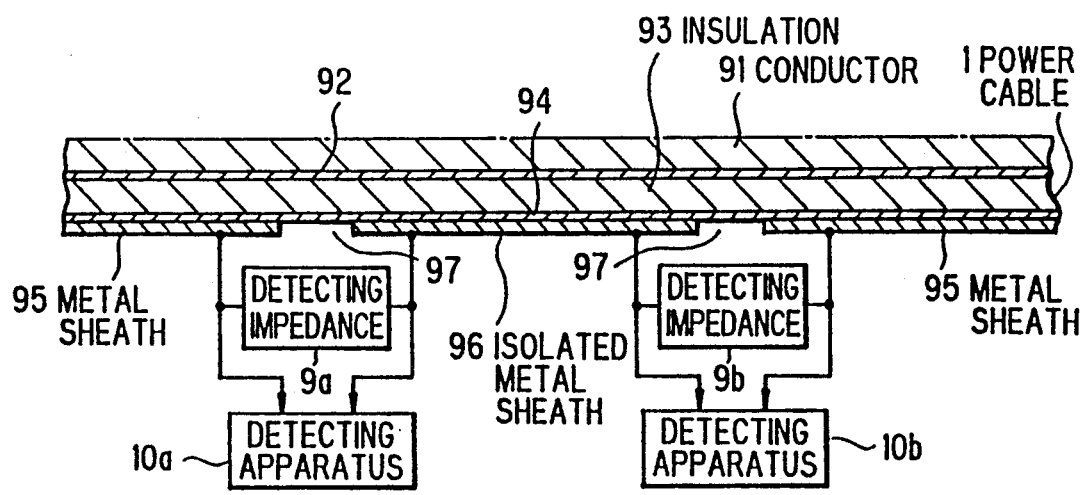

FIG. 10 shows a method for detecting partial discharge in an insulation of an electric power apparatus in a sixth preferred embodiment according to the invention, wherein like parts are indicated by like reference numerals as used in FIG. 10, except that the two detecting impedances 9a and 9b are provided at the sheath removed portions 9a and 9b to be connected across the sheath 95 and the isolated sheath 96, respectively, and the two partial discharge detecting apparatus 10a and 10b are provide to receive voltages generated across the detecting impedance 9a and 9b, respectively.

In the sixth preferred embodiment, partial discharge can be precisely detected, even if the two sheath removed portions 97 are relatively remote from each other to result in a long isolated sheath 96, because a partial discharge signal is received by any one of the partial discharge detecting apparatus 10a and 10b, before the partial discharge signal is attenuated.

Figure 11:
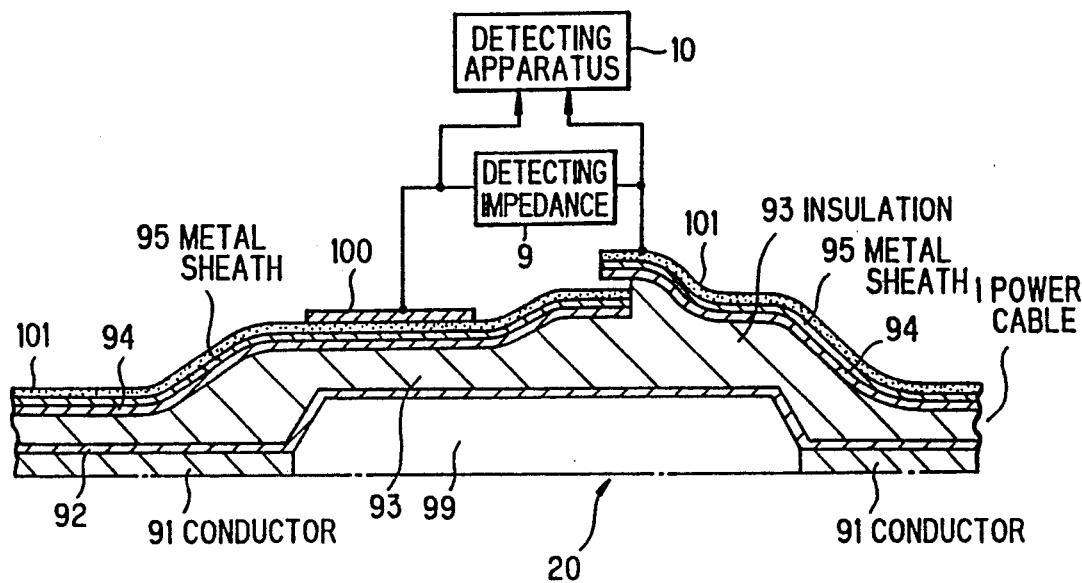

FIG. 11 shows a method for detecting partial discharge in an insulation of an electric power apparatus in a seventh preferred embodiment according to the invention, wherein like parts are indicated by like reference numerals as used in FIG. 9, except that the detecting impedance 9 and the partial discharge detecting apparatus 10 are connected across the metal sheath 95 separated at the insulating joint 20 including a connecting sleeve 99 for connecting the conductors 91 and an auxiliary electrode 100 provided on a poly-vinyl chloride sheath 101 covering the metal sheath 95. At the insulating joint 20, generally, a high voltage happens to be applied to the metal sheath 95, where an accident such as ground fault, etc. occurs in the power cable line. Even if such a high voltage is generated thereon, a high voltage proof capacitor is formed between the auxiliary electrode 100 and one of the separated sheaths 95, so that the partial discharge can be detected at the insulating joint 20.

Figure 12:
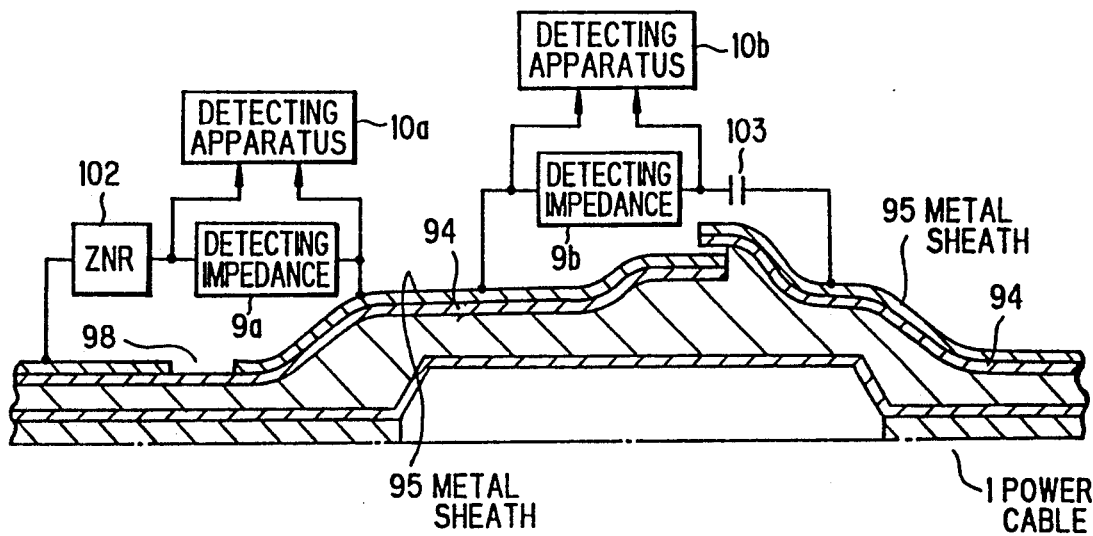

FIG. 12 shows a method for detecting partial discharge in an insulation of an electric power apparatus, wherein like parts are indicated by like reference numerals as used in FIGS. 9 to 11, except that a gapless arrester 102 is connected between the metal sheath 95 in the vicinity of the sheath removed portion 98 and the detecting impedance 9a, and a coupling capacitor 103 is connected between the metal sheath 95 and the detecting impedance 9b. The gapless arrester 102 protects the detecting impedance 9a and the partial discharge detecting apparatus 10a from a surge voltage, and provides a coupling capacitance in the partial discharge detecting system. The separated metal sheath 95 functions as an auxiliary electrode.

Figure 13:
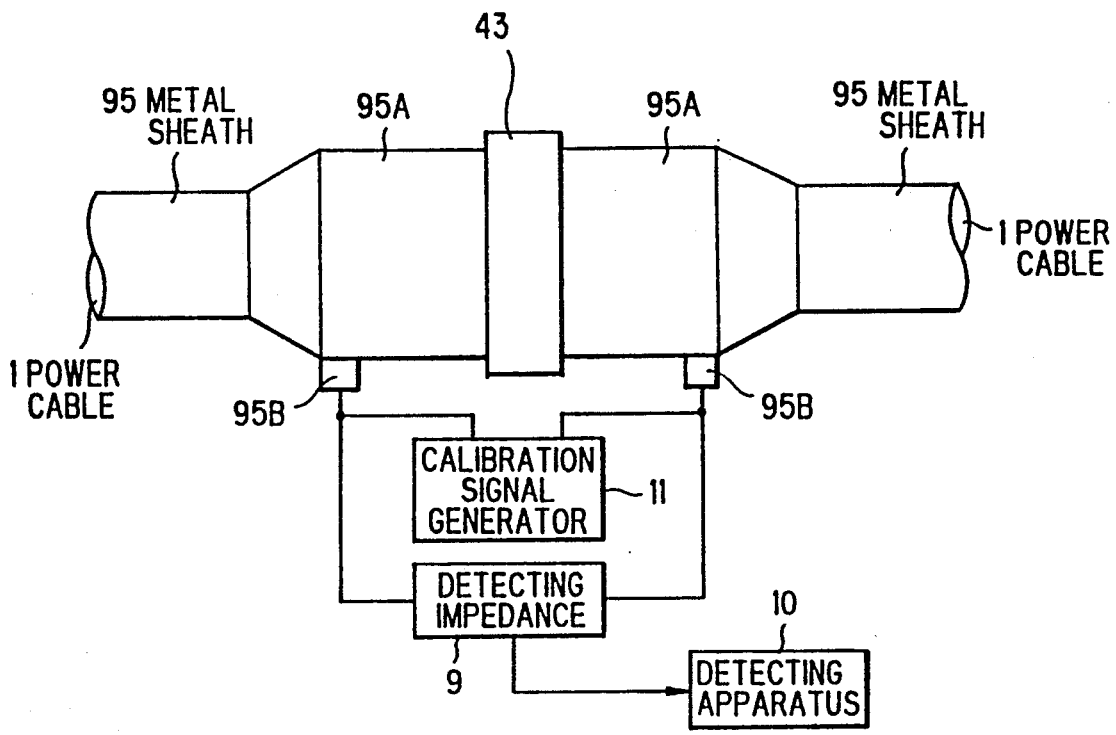
FIGS. 13 and 14 are an explanatory view, a circuitry diagram for carrying out calibrating operation in a method for detecting partial discharge in an insulation of an electric apparatus.

FIG. 13 shows a method for detecting partial discharge in an insulation of an electric power apparatus which comprises a calibration signal generator 11 connected to terminals 95B of metal sheath members 95A insulated by an insulating barrel member 43 and connected to metal sheaths 95 of power cables 1, along with a detecting impedance 9, and a partial discharge detecting apparatus 10 connected to the detecting impedance 9.

Figure 14:
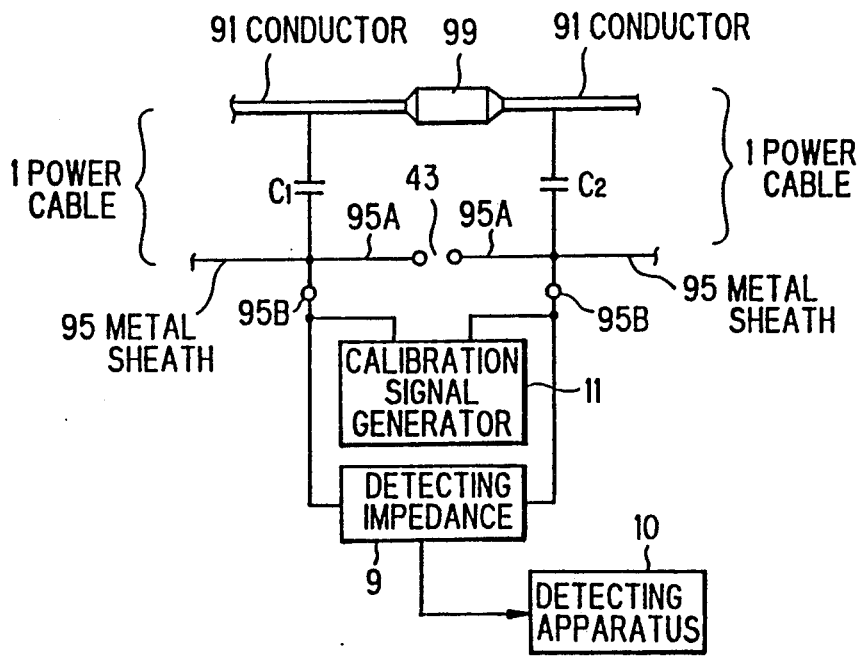

FIG. 14 shows a circuitry structure in the ninth preferred embodiment, in which conductors 91 of the power cables 1 are connected by a connecting sleeve 99, and capacitors $C_1$ and $C_2$ are formed between the conductors 91 and the metal sheaths 95 insulated by the insulating barrel member 43.

Figure 15A:
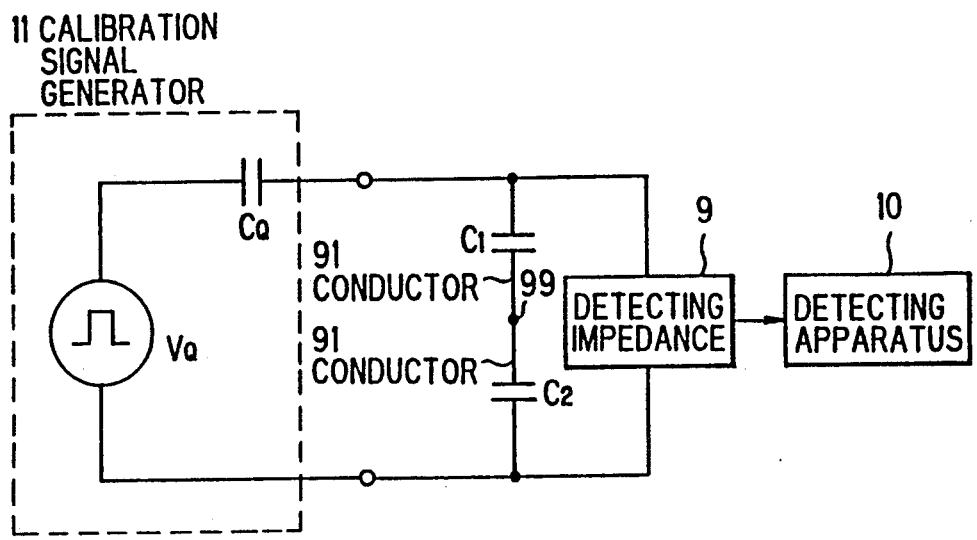
FIGS. 15A and 15B are equivalent circuits for explaining calibrating operation in the invention and the prior art.

FIG. 15A shows an equivalent circuit corresponding to the circuitry structure in the ninth preferred embodiment, wherein like parts are indicated by like reference numerals as used in FIG. 14.

In this equivalent circuit, it is assumed that the capacitances $C_1$ and $C_2$ are equal to each other, a value Z of the detecting impedance 9 is much greater than an impedance $Z_{C1}$ based on the capacitance $C_1$ $$\left( Z \gg Z_{C1} = \frac{1}{2\pi f C_1} \right),$$

and the capacitance $C_1$ is much greater than a capacitance $C_Q$ of the calibration signal generator 11 ($C_1 \gg C_Q$).

Thus, a voltage $V_2$ applied across both terminals of the detecting impedance 9 is obtained in the below equation (3).

$$V_2 = \frac{2C_Q}{C_1} V_Q \tag{3}$$

Here, $C_Q$, $C_1$, $C_2$ and $V_Q$ are known or can be detected.

Comparing the aforementioned equation (2) and the present equation (3), the below equation (4) is obtained.

$$V_2 = 2V_1 \tag{4}$$

provided that it is assumed that $C_C$ is $C_1$.

Figure 15B:
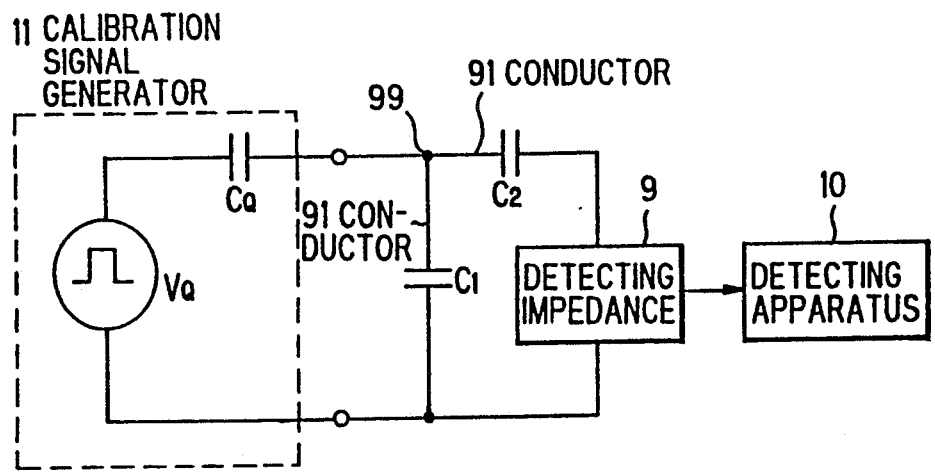

As understood from the equation (4), a high frequency pulse can be detected by a level which is two times as compared to the conventional method. Furthermore, the attenuation caused by the propagation of the high frequency pulse through a long power cable line can be negligible.

Where partial discharge occurs on the side of the capacitor $C_1$, the equivalent circuit of FIG. 15A is converted to that of FIG. 15B.

In the ninth preferred embodiment, it is assumed that $C_1$ is $C_2$, and Z is much greater than $Z_{C1}$ and $Z_{C1}$ as explained before. Even if these conditions are not met, however, the calibration can correctly be realized by calculating a correcting term inaccordance with the fundamental equation.

Figure 16:
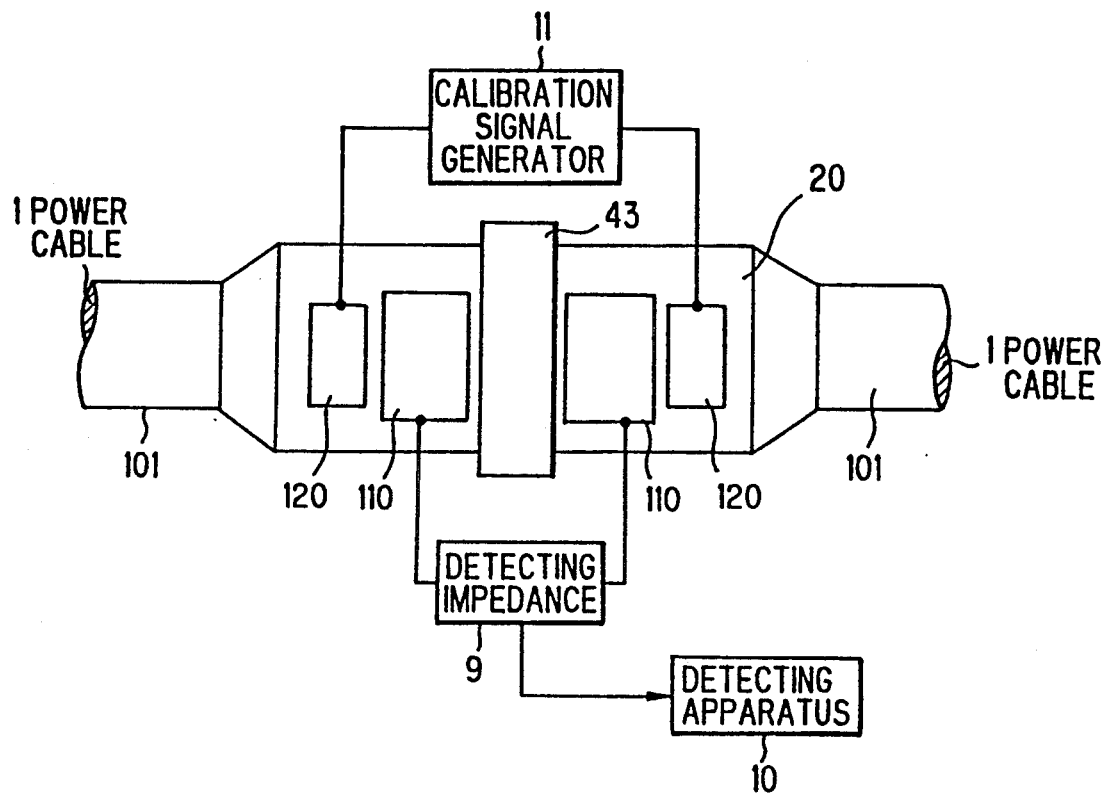
FIGS. 16, 17 and 18 are an explanatory view, a circuitry diagram, and an equivalent circuit for calibrating operation in a method for detecting partial discharge in an insulation of an electric apparatus in a tenth preferred embodiment according to the invention.

FIG. 16 shows a method for detecting partial discharge in an insulation of an electric power apparatus in a tenth preferred embodiment, wherein like parts are indicated by like reference numerals as used in FIG. 13, except that a first pair of detecting electrodes 110 and a second pair of calibrating electrodes 120 are provided on the poly-vinyl chloride sheath 101 of the insulating joint 20 having the insulating barrel member 43 to be connected to the detecting impedance 9 and the calibration signal generator 11, respectively.

Figure 17:
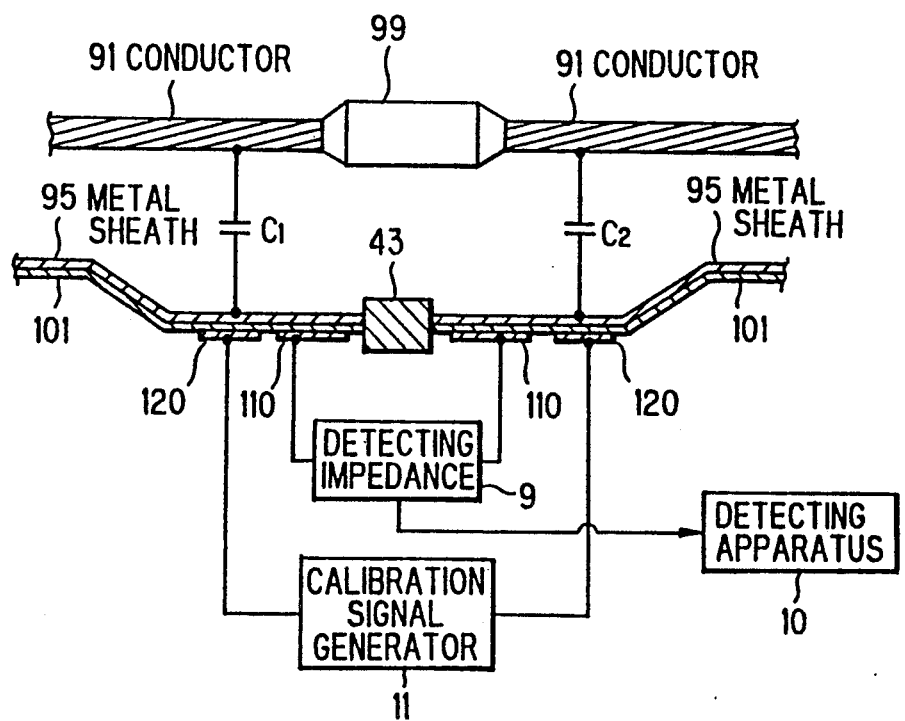

FIG. 17 shows a circuitry structure in the tenth preferred embodiment, which is similar to that of FIG. 14.

Figure 18:
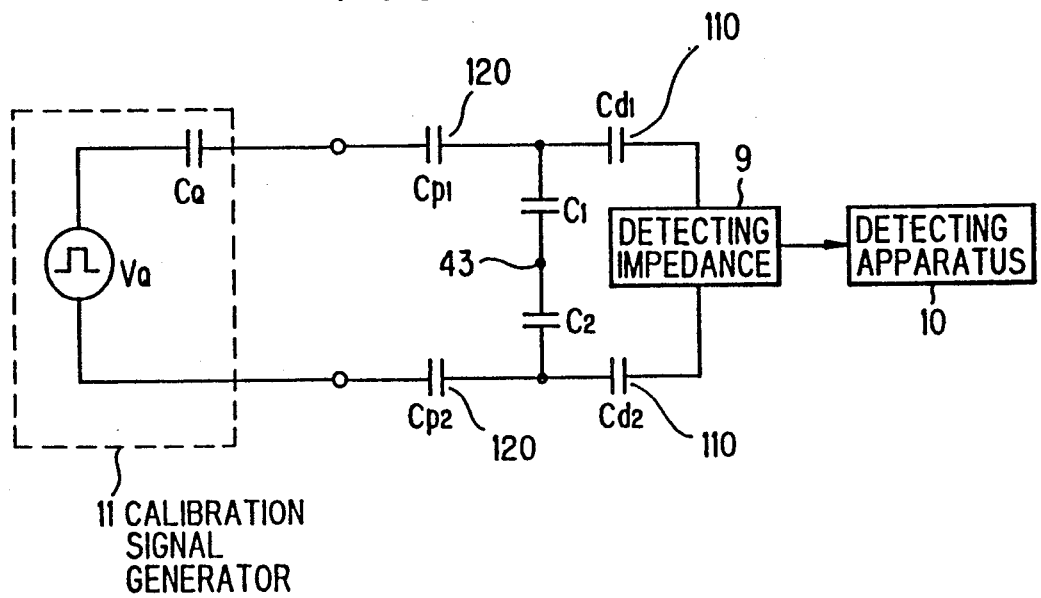

FIG. 18 shows an equivalent circuit corresponding to the circuitry structure of FIG. 17, wherein like parts are indicated by like reference numerals as used in FIG. 15A, except that capacitances $C_{d1}$ and $C_{d2}$ capacitors formed by the detecting electrodes 110 and capacitances $C_{p1}$ and $C_{p2}$ of capacitors formed by the detecting electrodes 120 are added to the circuit.

Here, the capacitances $C_{p1}$ and $C_{p2}$ are much greater than the capacitance $C_Q$ ($C_{p1}$, $C_{p2} >> C_Q$), respectively, and the detecting impedance Z is much greater than impedances $Z_{cd1}$ and $Z_{cd2}$ $$\left( Z >> Z_{cd1} = \frac{1}{2\pi f C_{d1}}, Z_{cd2} = \frac{1}{2\pi f C_{d2}} \right),$$

so that the equivalent circuit of FIG. 18 is simplified in the form of the equivalent circuit of FIG. 15B.

Practically, the capacitance $C_Q$ is approximately 10 to 50 pF, so that the detecting electrodes 120 for the calibration signal generator 11 are determined in size to provide a capacitance value of approximately 500 to 1000 pF, thereby resulting in the relation ($C_{p1}$, $C_{p2} >> C_Q$). The same is applied to the relation $Z >> Z_{cd1}$, $Z_{cd2}$).

Figure 19:
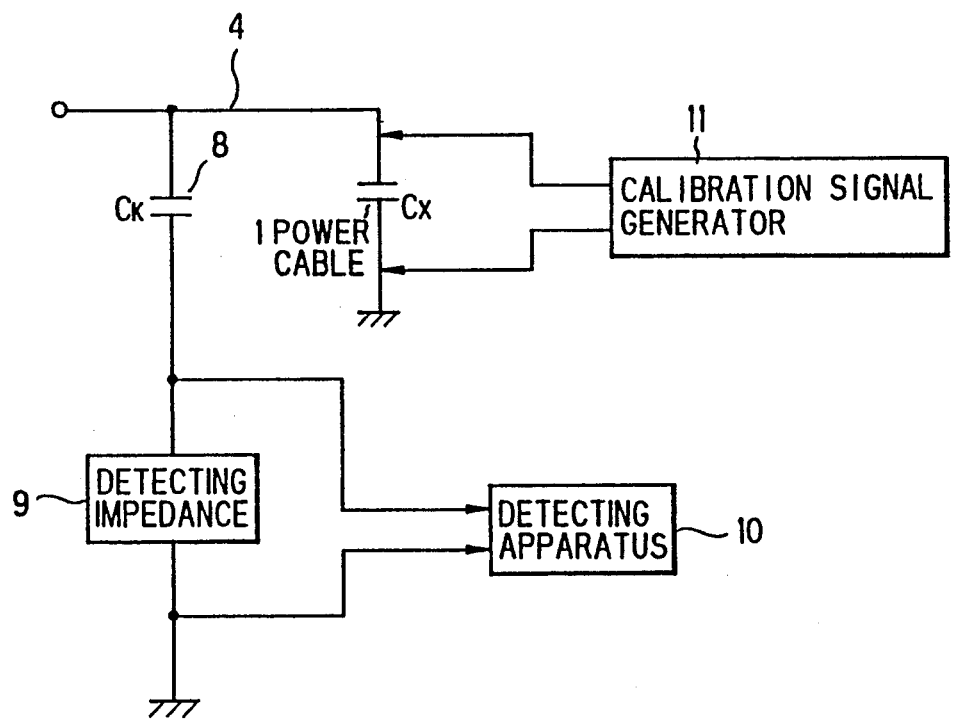
FIG. 19 is a circuitry diagram showing calibration operation in a conventional method for detecting partial discharge in an insulation of an electric apparatus.

FIG. 19 shows a simplified circuit for carrying out a method for detecting partial discharge in an insulation of an electric power cable in an eleventh preferred embodiment according to the invention, which comprises a calibrating signal generator 11 for supplying a pulse to a power cable 1 having a capacitance Cx connected to a high voltage conductor 4, and a detecting impedance 9, connected at one terminal through a coupling capacitor 8 to the high voltage conductor 4 and at the other terminal to the ground, to which a partial discharge detecting apparatus 10 for detecting a high frequency pulse at a predetermined frequency in a predetermined frequency range is connected. The power cable 1 is a cross-linked polyethylene insulated cable of a rated voltage 66 KV, to which a high voltage is applied through the high voltage conductor 4.

In operation, no voltage is applied to the power cable 1, and the calibration signal is controlled to stop operating. Thus, external noise is detected by the partial discharge detecting apparatus 10. A frequency spectrum of the detected noise is shown in FIG. 20A.

Figure 20A:
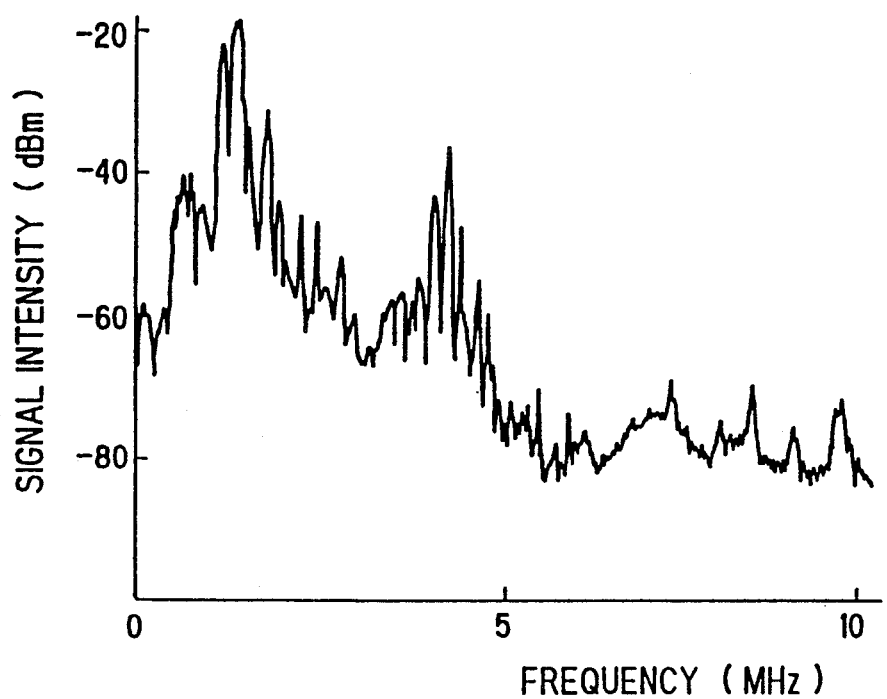
FIGS. 20A and 20B are frequency spectrums of noise and calibration pulse signal in the eleventh preferred embodiment.
Figure 20B:
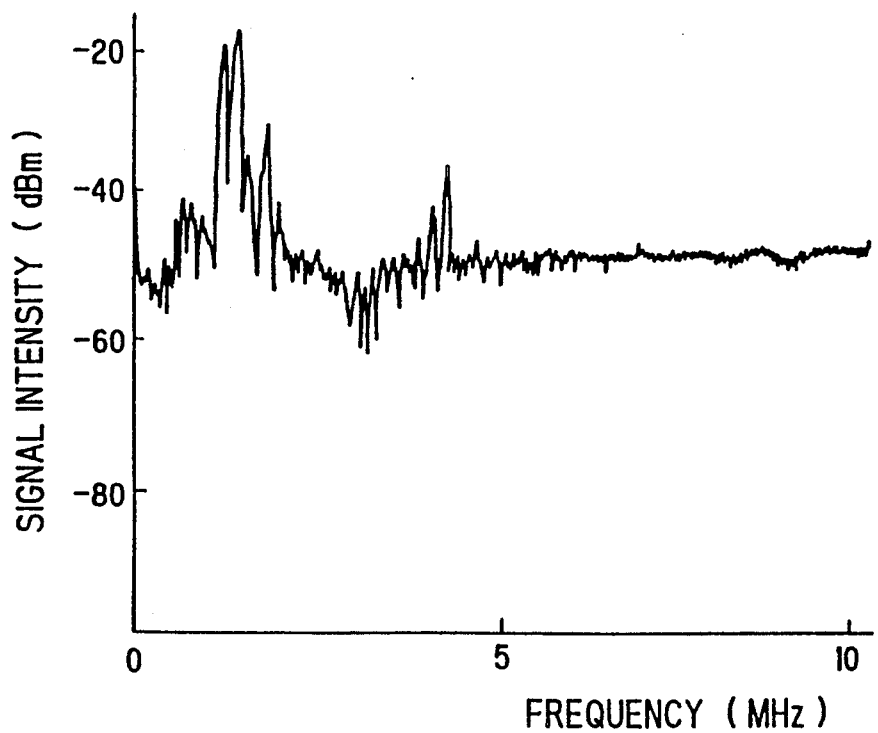

Then, a calibration pulse of 100 pC (picocoulomb) is supplied between a conductor of the power cable 1 and a metal sheath thereof from the calibration signal generator 11, so that the calibration pulse is detected through the detecting impedance 9 by the partial discharge detecting apparatus 10, in which a frequency spectrum of the detected calibration pulse is obtained as shown in FIG. 20B.

In comparing the frequency spectrums of FIGS. 20A and 20B, it is understood that the calibration pulse which is supplied from the calibration signal generator 11 to the power cable 1 does not contribute to the increase of a signal intensity resulted from the external noise in a frequency range less than approximately 3.5 MHz, and the signal intensity is kept to be approximately −50 dB in the frequency range more than that frequency by the calibration pulse, while the signal intensity of the external noise is decreased to be less than −60 dB in that frequency range except for the vicinity of 4 MHz, especially remarkably decreased in the frequency range from 4.5 MHz to 5.5 MHz, and to be less than −70 dB in the frequency range more than 5.5 MHz. As apparent from the frequency spectrums, a S/N ratio becomes high in the frequency range from 4.8 MHz to 10 MHz. Especially, the noise level is remarkably low at the frequencies of 5.5 MHz, 6.2 MHz and 9.2 MHz, so that a high S/N ratio is obtained at these frequencies. For instance, where a detecting frequency of 5.5 MHz is selected, a S/N ratio of 34 dB is obtained, because levels of the external noise and the calibration pulse are −82 dB and −48 dB, respectively. In this state, a detecting limitation is one fiftieth of 100 pC which is 2 pC.

For comparison with a conventional method, a low frequency detecting method is carried out by using a detecting impedance, a bandpass filter, and an amplifier, wherein an amplified frequency is continuously varied in the range of 10 KHz to 150 KHz, and of 10 KHz to 1000 KHz, thereby detecting a S/N ratio. In this conventional method, a detecting limitation is approximately 70 pC. This means that a high sensitivity is not obtained in the low frequency detecting method.

Furthermore, a tuning type partial discharge detecting apparatus which is manufactured and sold by the Nippon Keisokuki Manufacturing, Inc. of Japan is adopted to detect partial discharge by using a tuning frequency of 400 KHz. As a result, a S/N ratio of 10 dB, and a detecting limitation of 30 pC is obtained. This means that the sensitivity is one fifteenth of that obtained in the method of FIG. 19, in which a frequency of 5.5 MHz is selected.

Figure 21:
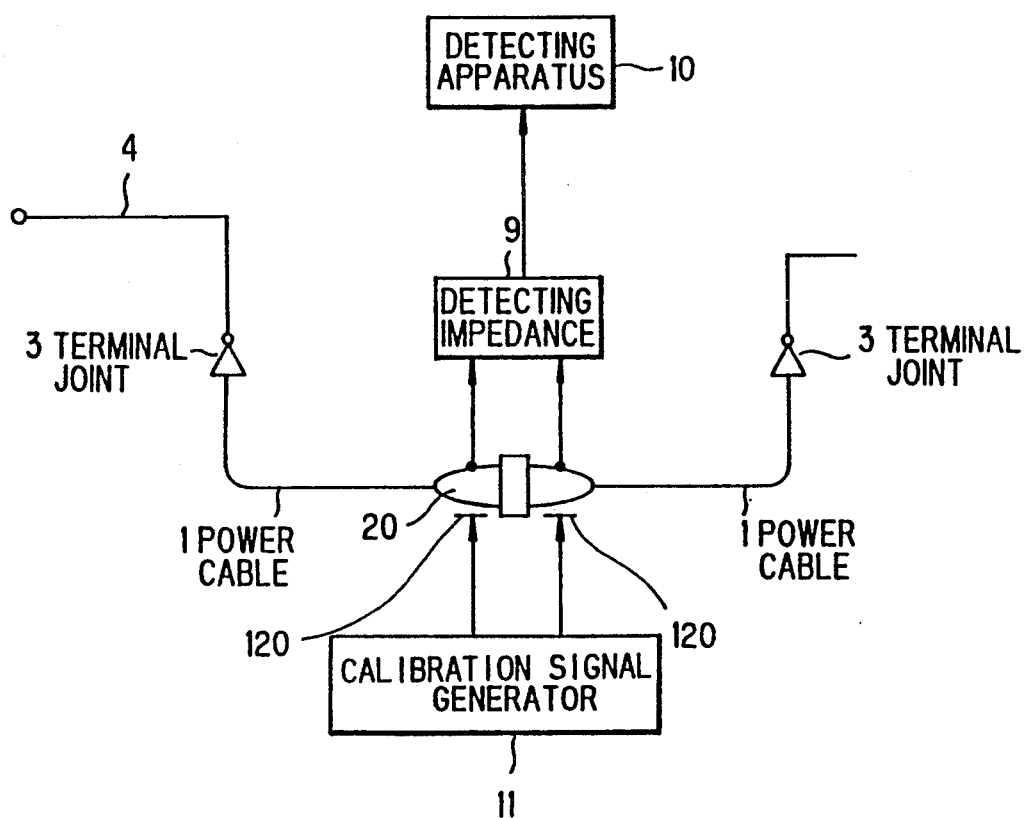
FIG. 21 is an explanatory diagram showing calibration operation in a method for detecting partial discharge in an insulation of an electric apparatus in a twelfth preferred embodiment according to the invention.

FIG. 21 shows a method for detecting partial discharge in an insulation of an electric apparatus in a twelfth preferred embodiment according to the invention, wherein like parts are indicated like reference numerals as used in FIG. 19, except that a calibration signal generator 11 is connected to metal foil electrodes 120 provided on the insulating joint 20.

Operation is carried out in the same manner as in the eleventh preferred embodiment, and the same result is obtained.

Figure 22A:
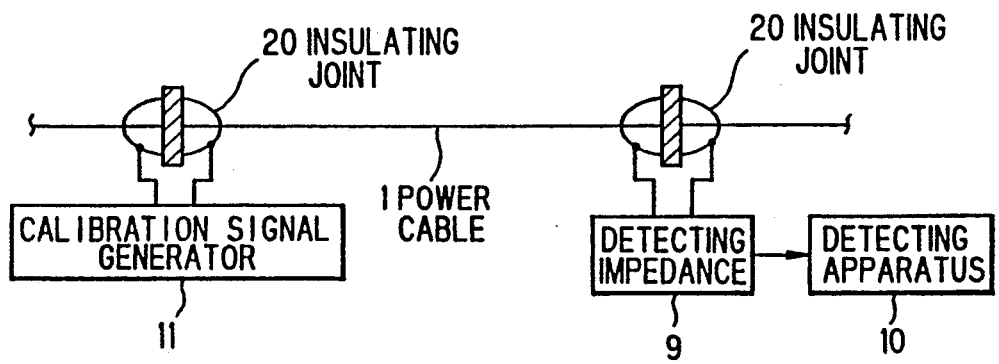
FIGS. 22A to 22C are explanatory diagrams showing modification circuits for calibrating operation in the twelfth preferred embodiment.
Figure 22B:
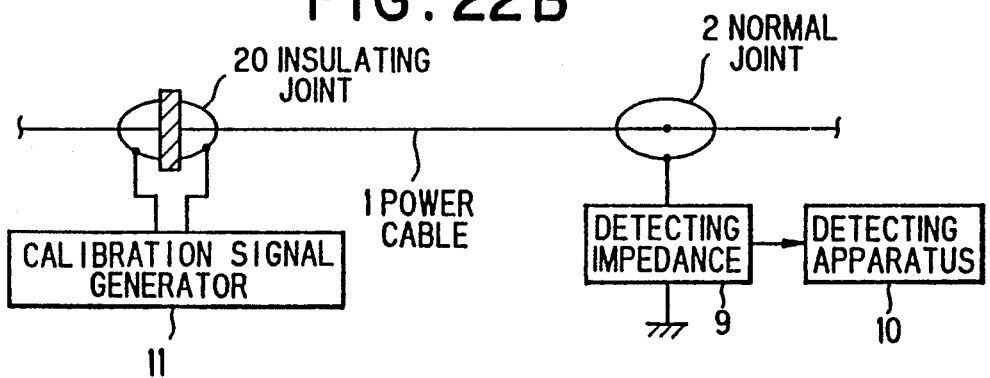
Figure 22C:
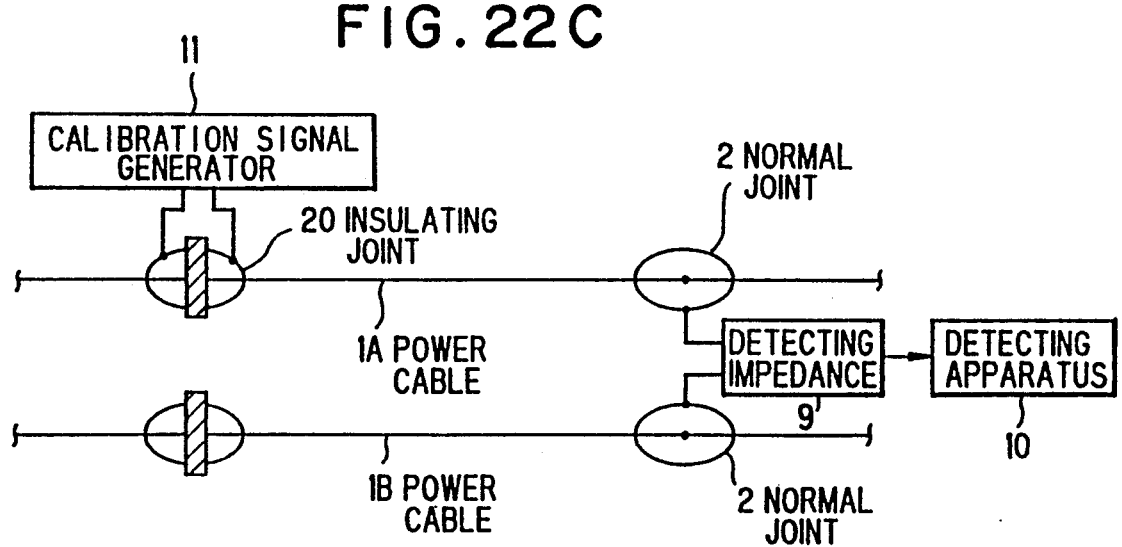

FIGS. 22A to 22C show modifications of the method for detecting partial discharge in an insulation of an electric apparatus in the twelfth preferred embodiment. In FIG. 22A, the calibration signal generator 11 is connected to an insulating joint 20, and a detecting apparatus including the detecting impedance 9 and the partial discharge detecting apparatus 10 is connected to another insulating joint communicated to the former insulating joint 20 by the power cable 1. In FIG. 22B, the calibration signal generator 11 is connected to an insulating joint 20, and the detecting impedance 9, etc. are connected to a normal joint 2. In FIG. 22C, the calibration signal generator 11 is connected to an insulating joint 20 of a power cable 1A, and the detecting impedance 9 is connected between non-ground type normal joints 2 of the power cable 1A and a power cable 1B of a different phase.

Figure 23:
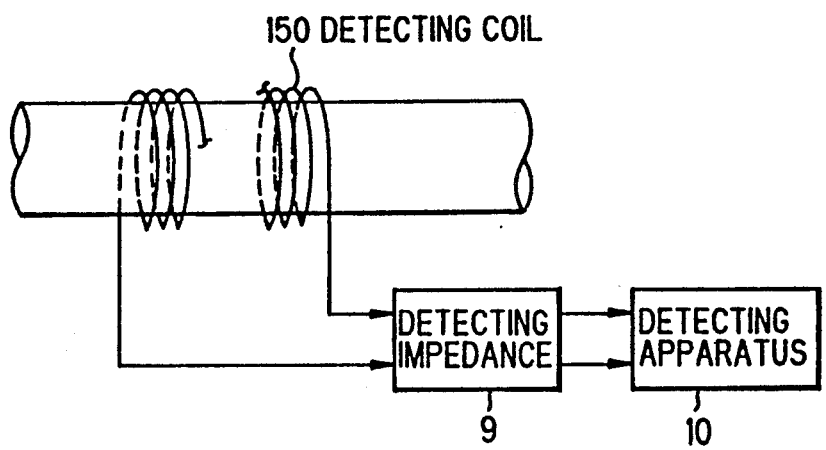
FIG. 23 is an explanatory view showing a method for detecting partial discharge in an insulation of an electric apparatus in a thirteenth preferred embodiment according to the invention.

FIG. 23 shows a method for detecting partial discharge in an insulation of an electric apparatus in a thirteenth preferred embodiment according to the invention, which comprises a 66 KV wire shielded cable 1 having a length of 10 m, a detecting coil 150 having 20 turns provided around the cable 1, a detecting impedance 9 connected to terminals of the detecting coil 150, and a partial discharge detecting apparatus 10 connected to the detecting impedance 9.

Figure 24:
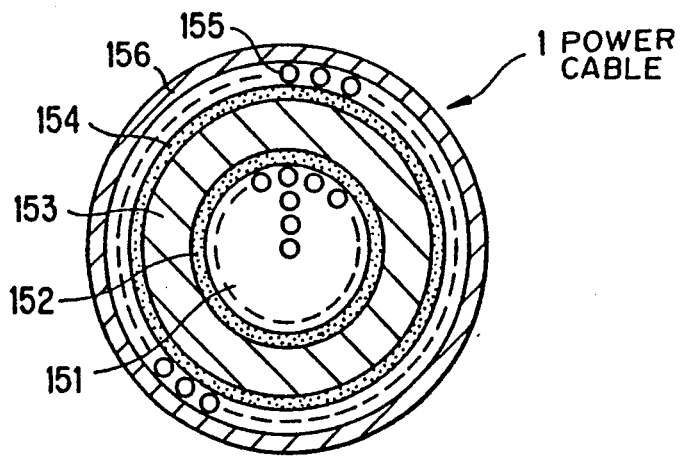
FIG. 24 is a cross-sectional view showing a wire shielded electric power cable in the thirteenth preferred embodiment.

FIG. 24 shows the wire shielded cable 1 which has a cross-sectional area of 100 mm$^2$ and comprises an electric conductor 151 of copper or aluminum wires, an inner semi-conductive layer 152 of, for instance, cross-linked polyethylene pregnant with conductive carbon surrounding the conductor 151, an insulation 153 of, for instance, cross-linked polyethylene provided around the inner semi-conductive layer 152, an outer semi-conductive layer 154 provided around the insulation 153, a wire shielding layer 155 of spiralled copper wires, and an anti-corrosion layer 156 of, for instance, poly-vinyl chloride.

Figure 25:
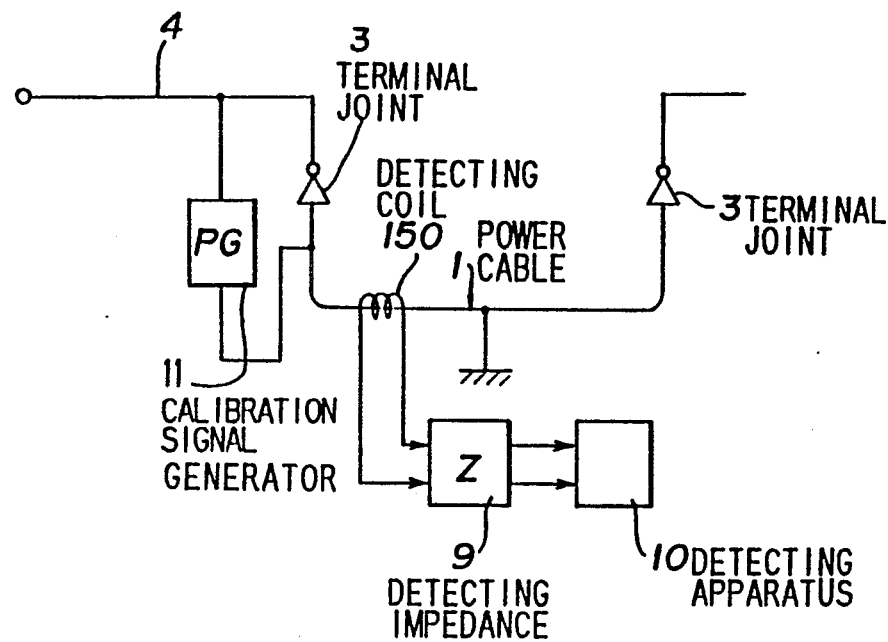
FIG. 25 is an explanatory diagram showing a whole in the thirteenth preferred embodiment.

FIG. 25 shows a whole circuitry structure in the thirteenth preferred embodiment, wherein like parts are indicated by like reference numerals as used before.

Figure 26A:
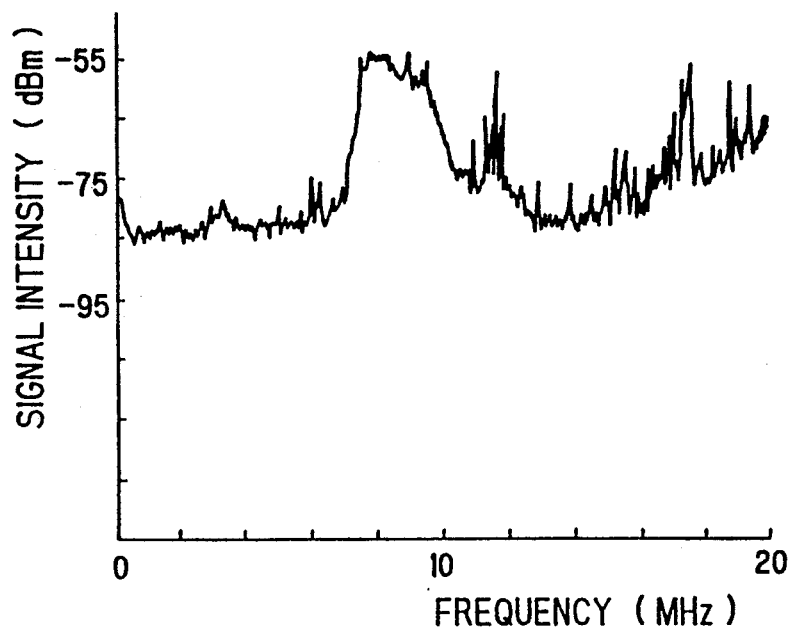
FIGS. 26A and 26B are frequency spectrums showing signal intensities based on noise and calibration in the thirteenth preferred embodiment.

In operation, a predetermined line voltage is applied to the wire shielded cable 1, and a frequency spectrum of external noise is obtained as shown in FIG. 26A by use of the detecting coil 150, the detecting impedance 9, and the detecting apparatus.

Figure 26B:
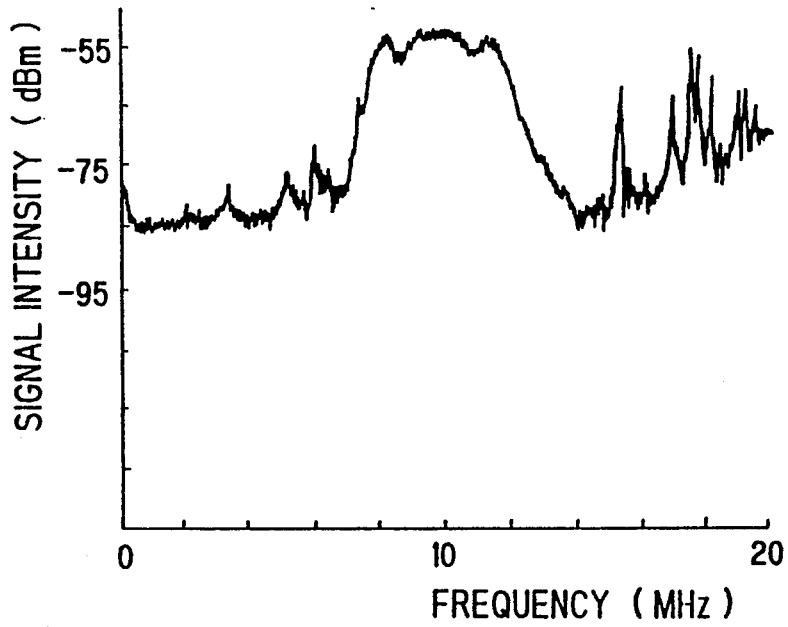

Next, a calibration pulse of 20 pC is supplied to the high voltage conductor 4 by the calibration signal generator 11, and a frequency spectrum of the calibration pulse including the external noise propagated through the wire shielded cable 1 is also obtained as shown in FIG. 26B by use of the detecting coil 150, the detecting impedance 9, and the detecting apparatus 10.

As apparent from the comparison between the frequency spectrums of FIGS. 26A and 26B, the highest sensitivity is obtained at a frequency of approximately 11 MHz, and the effect of supplying the calibration pulse is not observed in the frequency range less than approximately 7 MHz. At a frequency of 11 MHz, a noise level is $-75$ dB, and a calibration pulse level including the noise level is $-55$ dB, so that a S/N ratio of 20 dB is obtained in the state that a detecting limitation is approximately 3 pC. At a frequency of 7 MHz, the noise and calibration pulse levels are both approximately $-80$ dB, so that a S/N ratio becomes 0 dB, thereby making it impossible to detect the calibration pulse.

It is considered that the noise is mainly caused by electro-magnetic wave in the air, noise current flowing through the shielding wire layer 155, and the floating of the ground potential due to noise current flowing through the ground. Furthermore, the reason why the detecting sensitivity is decreased at lower than a frequency of 7 MHz is that a voltage induced on the detecting coil 150 is proportional to a frequency, and the magnetic coupling between the detecting coil 150 and the wire shielded cable 1 is not dense to result in mismatching with an impedance of the cable 1 at a low frequency, and the reason why the detecting sensitivity is decreased at more than a frequency of 14 MHz is that the calibration pulse is attenuated by itself and impedance matching is not good between the detecting coil 150 and the cable 1.

Figure 27:
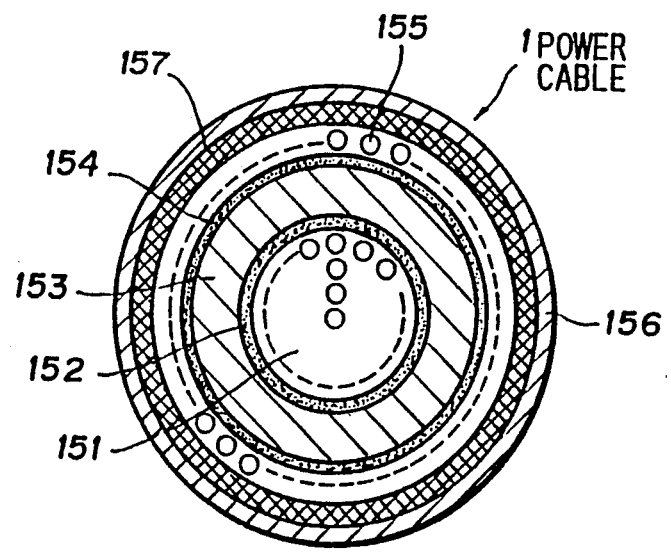
FIG. 27 is a cross-sectional view showing another wire shielded electric power cable in the thirteenth referred embodiment.

In the modification of the thirteenth embodiment, a wire shielded cable 1 as shown in FIG. 27 is used in place of the wire shielded cable 1 as shown in FIG. 24, wherein like parts are indicated by like references in the both cables 1, except that a stainless steel sheath 157 is provided between the wire shielding layer 155 and the anti-corrosion layer 156 in FIG. 27. The detecting coil 150 having 5 turns is provided around the cable 1 having a length of 5 m which is in the state of short-circuit at a remote end thereof.

In operation, a calibration pulse of 2,500 pC having a rise time of 30 ns is supplied between the conductor 151 and the stainless steel sheath 157 at a near end of the cable 1, and the calibration pulse is detected by use of the detecting coil 150, the detecting impedance 9, and the detecting apparatus 10.

Figure 28A:
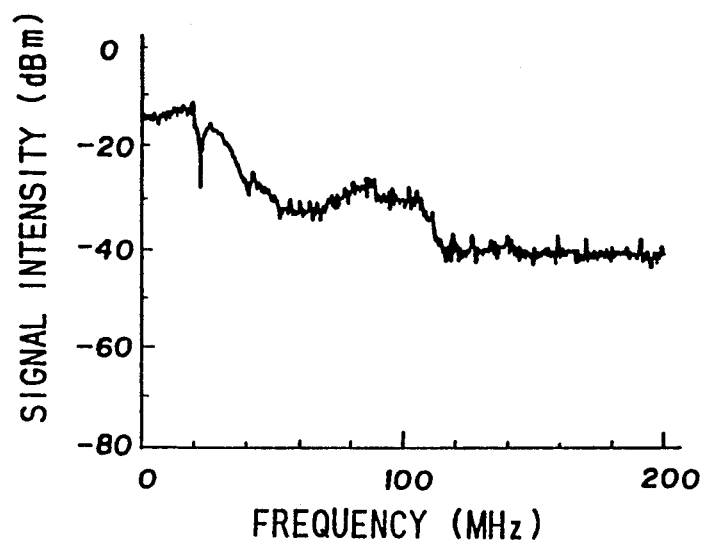
FIGS. 28A and 28B are frequency spectrums showing signal intensities in use of the electric power cable of FIG. 27 in the thirteenth preferred embodiment.

The detected result is shown in FIG. 28A, from which it is understood that the calibration pulse is detected to be $-13$ dB at a frequency of 20 MHz, and $-31$ dB at a frequency of 100 MHz. Furthermore, the calibration pulse is detected to be less than a noise level of an amplifier in the detecting apparatus 10 at a frequency of more than 120 MHz.

In a further modification of the thirteenth embodiment, the stainless steel sheath 157 is removed in an axial direction of the cable 1 by 100 mm, and the detecting coil 150 is provided in the center of the stainless steel sheath removed portion by 5 turns.

Figure 28B:
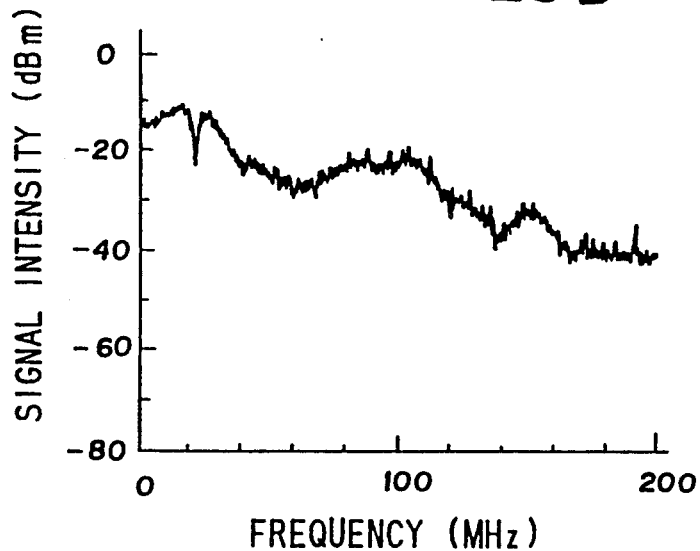

The calibration pulse, which is the same as in the aforementioned modified thirteenth preferred embodiment, is supplied to the cable 1. The detected result is shown in FIG. 28B, in which the calibration pulse is detected to be $-11$ dB at a frequency of 20 MHz, and $-22$ dB at a frequency of 10 MHz. In the frequency rang of more than 170 MHz, a detected signal level is less than a noise level of the amplifier of the detecting apparatus 10.

In comparison between the results of FIGS. 28A and 28B, the decrease of the detected signal is approximately 2 dB at a frequency of 20 MHz, and 9 dB at a frequency of 100 MHz in accordance with a provision of the stainless steel sheath 157. This means that partial discharge can be detected in a wire shielded cable without removing an outer metal sheath in the invention, although a detecting sensitivity is lowered to some extent.

Figure 29:
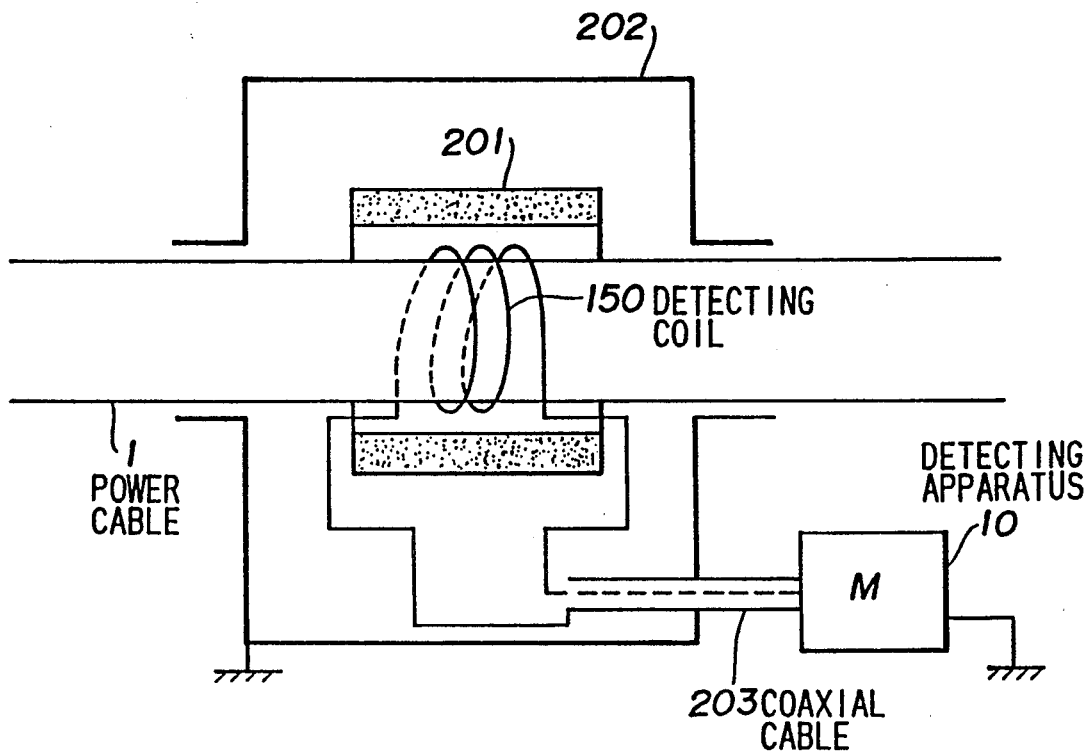
FIGS. 29 and 30 are explanatory diagrams showing methods for detecting partial discharge in an insulation of an electric apparatus in fourteenth and fifteenth preferred embodiments according to the invention.

FIG. 29 shows a method for detecting partial discharge in an insulation of an electric apparatus in a fourteenth preferred embodiment according to the invention. In this method, the detecting coil 150 is covered by a magnetic core 201 and an aluminum shielding box 202, such that the detecting coil 150 is connected through a coaxial cable 203, which is passed through a wall of the box 202, to the detecting apparatus 10. As a result, the detecting coil 150 is protected from picking external noise up.

Figure 30:
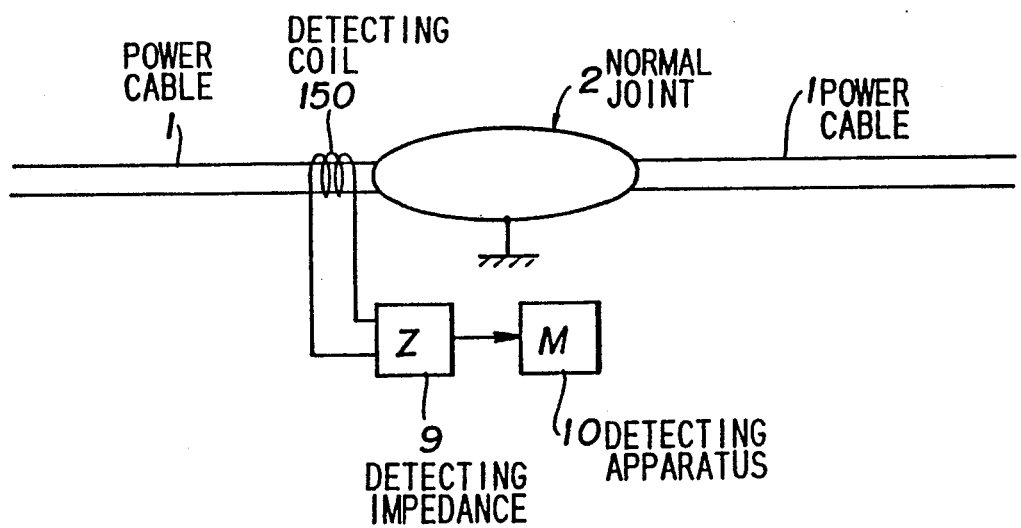

FIG. 30 shows a method for detecting partial discharge in an insulation of an electric apparatus in a fifteenth preferred embodiment according to the invention, wherein the detecting coil 150 is provided around the wire shielded cable 1 in the vicinity of the normal joint 2, and the detecting impedance 9 is connected to the detecting coil 150, thereby supplying a partial discharge signal to the detecting apparatus 10.

In operation, partial discharge occurring in the normal joint 2 is detected with a high sensitivity, because the partial discharge signal is not attenuated substantially.

Figure 31A:
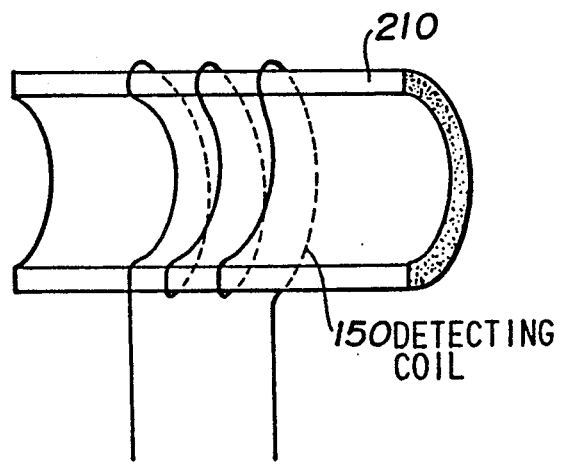
FIGS. 31A and 31B are explanatory views showing a modification in the fourteenth and fifteenth embodiments.
Figure 31B:
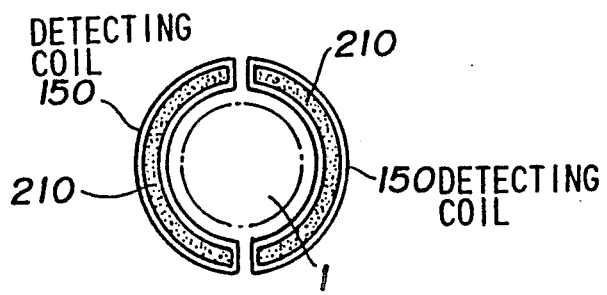

FIGS. 31A and 31B show two detecting coils 150 each wound on a semi-circular magnetic core 210, and positioned around the wire shielded cable 1 to face each other, such that the two detecting coils 150 are connected in series to provide a single detecting coil.

Figure 32:
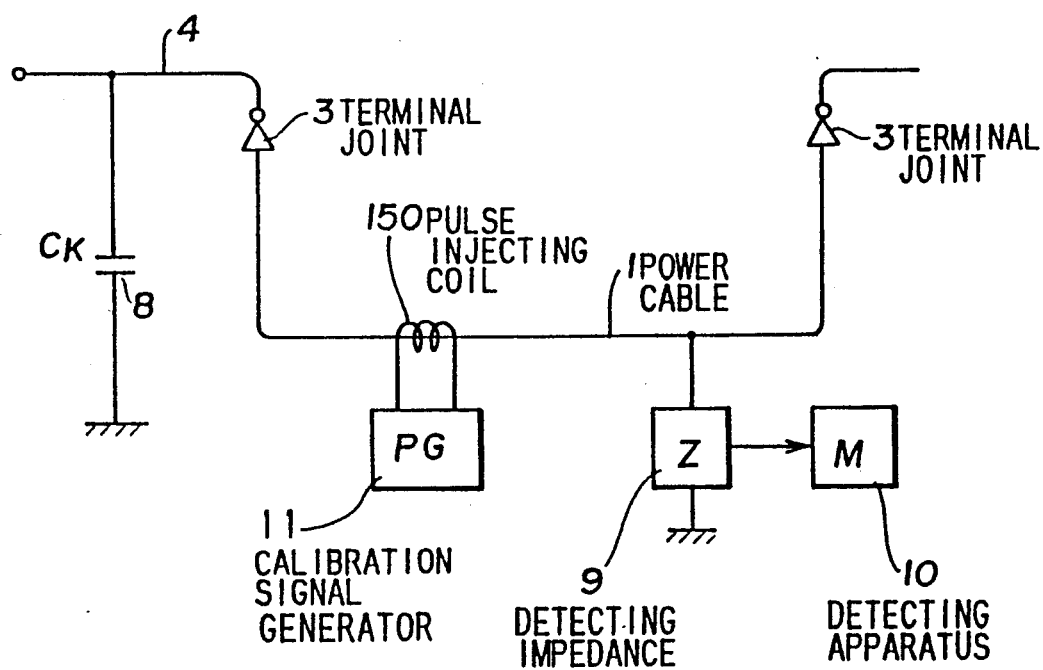
FIG. 32 is an explanatory diagram showing a method for detecting partial discharge in an insulation of an electric apparatus in a sixteenth preferred embodiment according to the invention.

FIG. 32 shows a method for detecting partial discharge in an insulation of an electric apparatus in a sixteenth preferred embodiment according to the invention, wherein like parts are indicated by like reference numerals as used before, except that the pulse injecting coil 150 is used to be connected to the pulse generator 130, and the detecting impedance 9 is connected between the stainless steel sheath 157 of the wire shielded cable i and the ground.

Figure 33A:
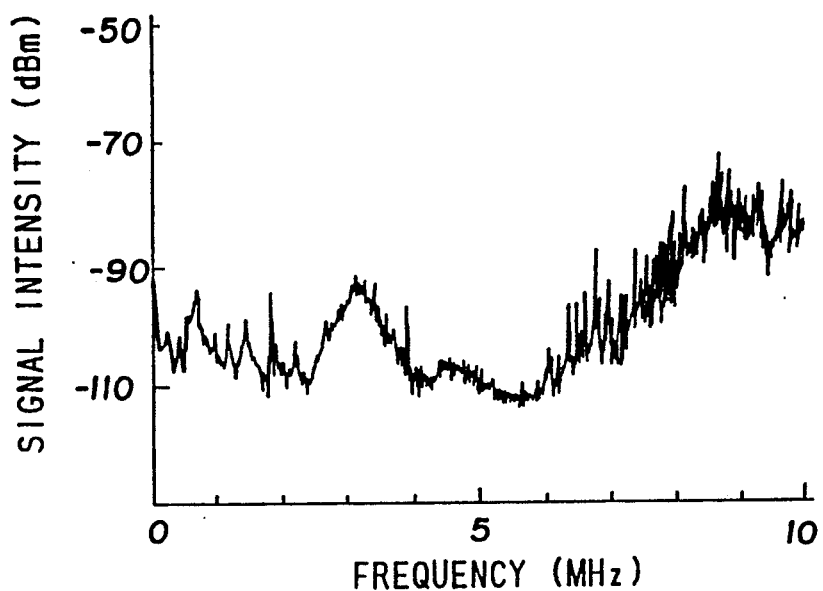
FIGS. 33A and 33B are frequency spectrums showing signal intensities based on noise and calibration pulse in the sixteenth preferred embodiment.

In operation, external noise is detected as shown in FIG. 33a, by the detecting apparatus 10, in the state that a predetermined line voltage is applied to the wire shielded cable 1, and no calibration signal is injected into the wire shielded cable 1 from the pulse generator 130. Next, a calibration signal which is injected through the pulse injecting coil 150 from the pulse generator 130 into the wire shielded cable 1 is detected as shown in FIG. 33B by the detecting apparatus 10, in the state that the line voltage is applied to the wire shielded cable 1.

Figure 33B:
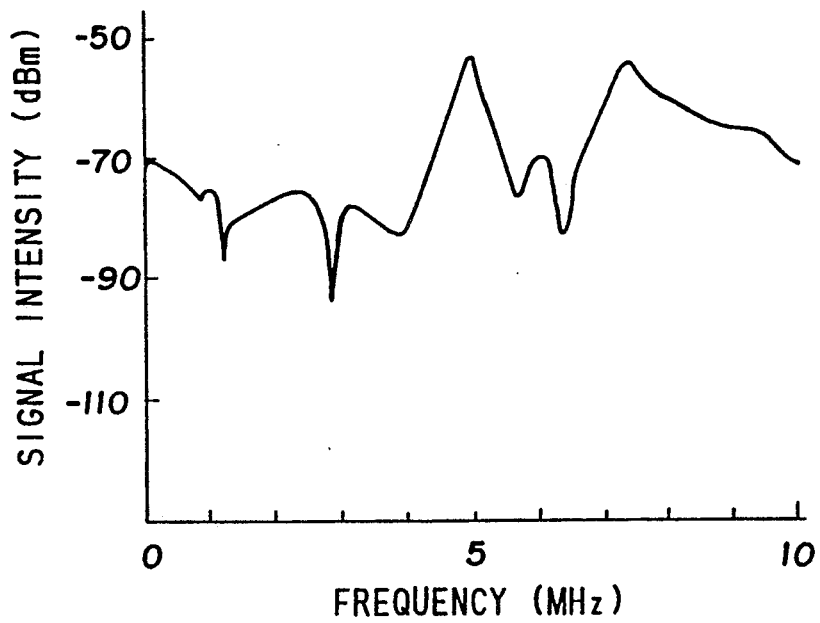

As apparent from the frequency spectrums of FIGS. 33a and 33B, a S/N ratio of 57 dB is obtained at a frequency of 5 MHz in accordance with a noise level of approximately $-110$ dB and a calibration pulse level of approximately $-53$ dB, and a S/N ratio of 23 dB is obtained at a frequency of 6.4 MHz in accordance with a noise level of approximately $-53$ dB and a calibration signal level of approximately $-83$ dB.

In this sixteenth preferred embodiment, the pulse injecting coil 150 is positioned at a place such as a normal joint 2, in which partial discharge tends to occur.

Figure 34A:
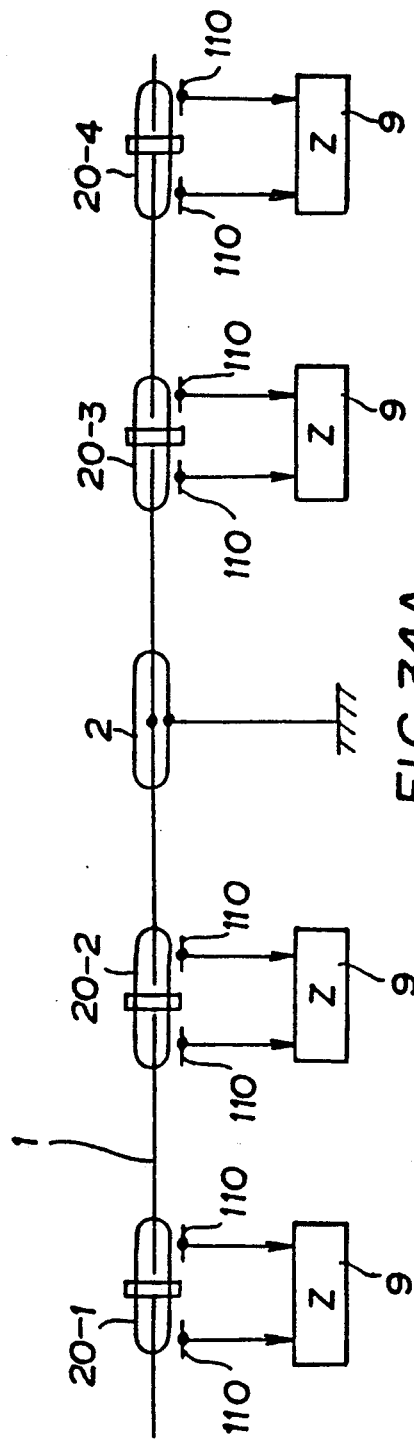
FIGS. 34A and 34B are an explanatory diagram and a graph indicating a signal intensity for location of partical discharge in a method for detecting partial discharge in an insulation of an electric apparatus in a seventeenth preferred embodiment according to the invention.

FIG. 34A shows a method for detecting partial discharge in an insulation of an electric apparatus in a seventeenth preferred embodiment according to the invention. In this method, the power cables 1 are connected by the insulating joints 20-1, 20-2, 20-3, and 20-4, and the normal joint 2. At each of the insulating joints 20-1, 20-2, 20-3, and 20-4, a pair of metal foil electrodes 110 are provided to be connected to the detecting impedance 9.

In operation, where partial discharge occurs in one of the insulating and normal joints, an electric potential which is reversely proportional to a distance from the partial discharge is generated across each of the detecting impedance 9, as indicated in the below table.

| INSULATING JOINT | SIGNAL INTENSITY |
| --- | --- |
| 2-1 | $-75$ dBm |
| 2-2 | $-65$ dBm |
| 2-3 | $-65$ dBm |
| 2-4 | $-79$ dBm |

Figure 34B:
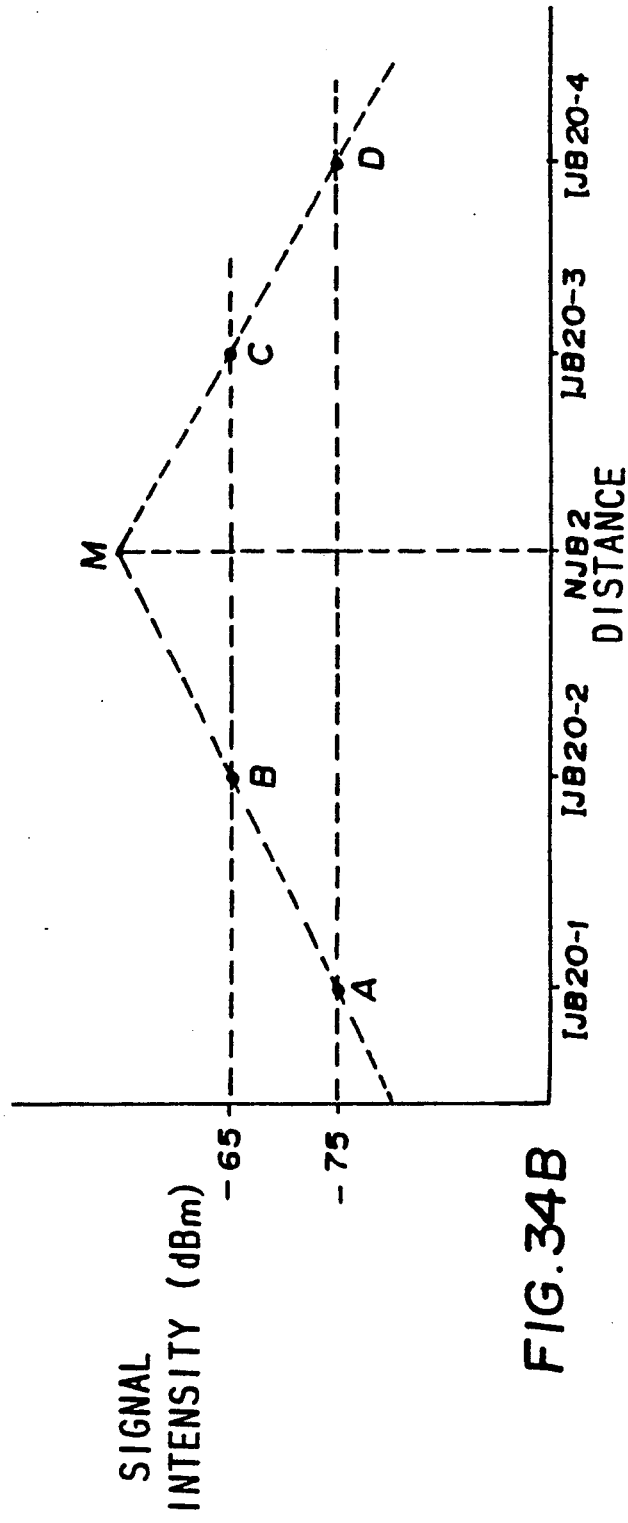

This detected results are also shown in FIG. 34B, in which the maximum value M is obtained by connecting the signal intensity points A, B, C, and D. As a result, it is concluded that the partial discharge is located at the normal joint 2.

Figure 35:
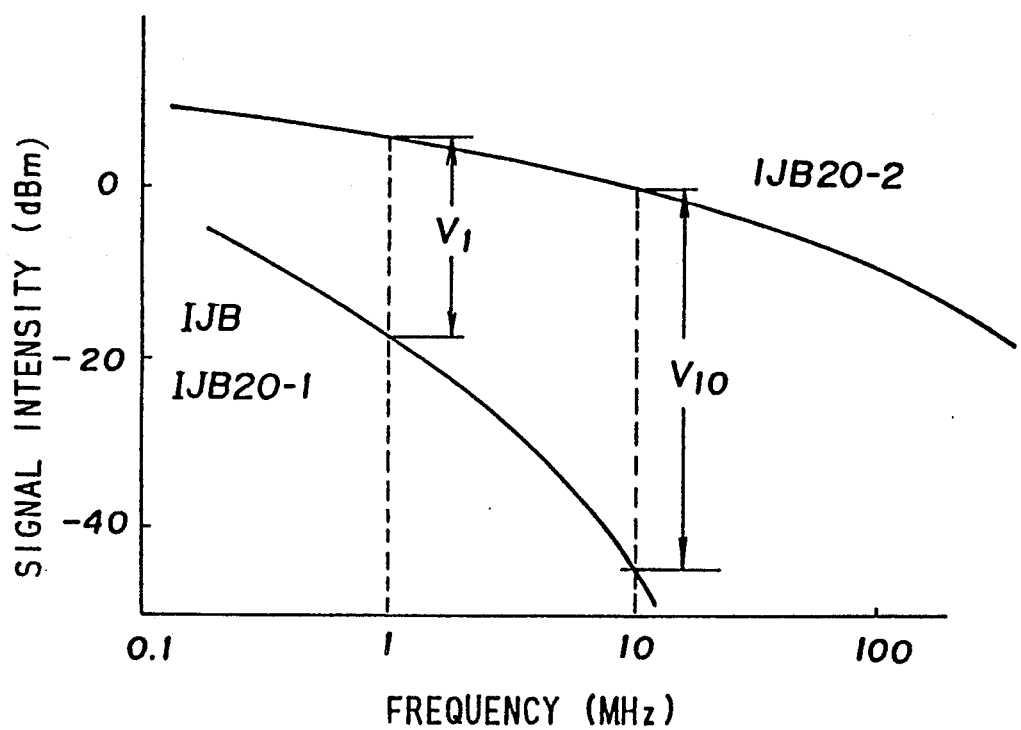
FIG. 35 is another graph indicating signal intensities in the seventeenth preferred embodiment.

Next, frequency spectrums of the signals which are obtained at the insulting joints 20-1 and 20-2 are detected by the detecting apparatus (not shown) connected to the detecting impedances 9. The frequency spectrums are shown in FIG. 35, in which signal intensity differences $V_1$ and $V_{10}$ are calculated at frequencies of 1 MHz and 10 MHz respectively. Then, a difference $\Delta V$ between the differences $V_1$ and $V_{10}$ is calculated in the below equation.

$$\Delta V = V_{10} - V_1$$

Thus, the partial discharge is located in accordance with the difference $\Delta V$ and a frequency difference f (10 MHz–1 MHz). Where the located results in FIGS. 34B and 35 are combined, a precision of locating the partial discharge is more increased.

FIG. 36A explains location of partial discharge in a method for detecting partial discharge in an insulation of an electric apparatus in an eighteenth preferred embodiment according to the invention. In this method, reference numerals 20-5, 20-6, 20-7, and 20-8 designate the insulating joints, and 2-2 and 2-3 designate the normal joints.

Figure 36B:
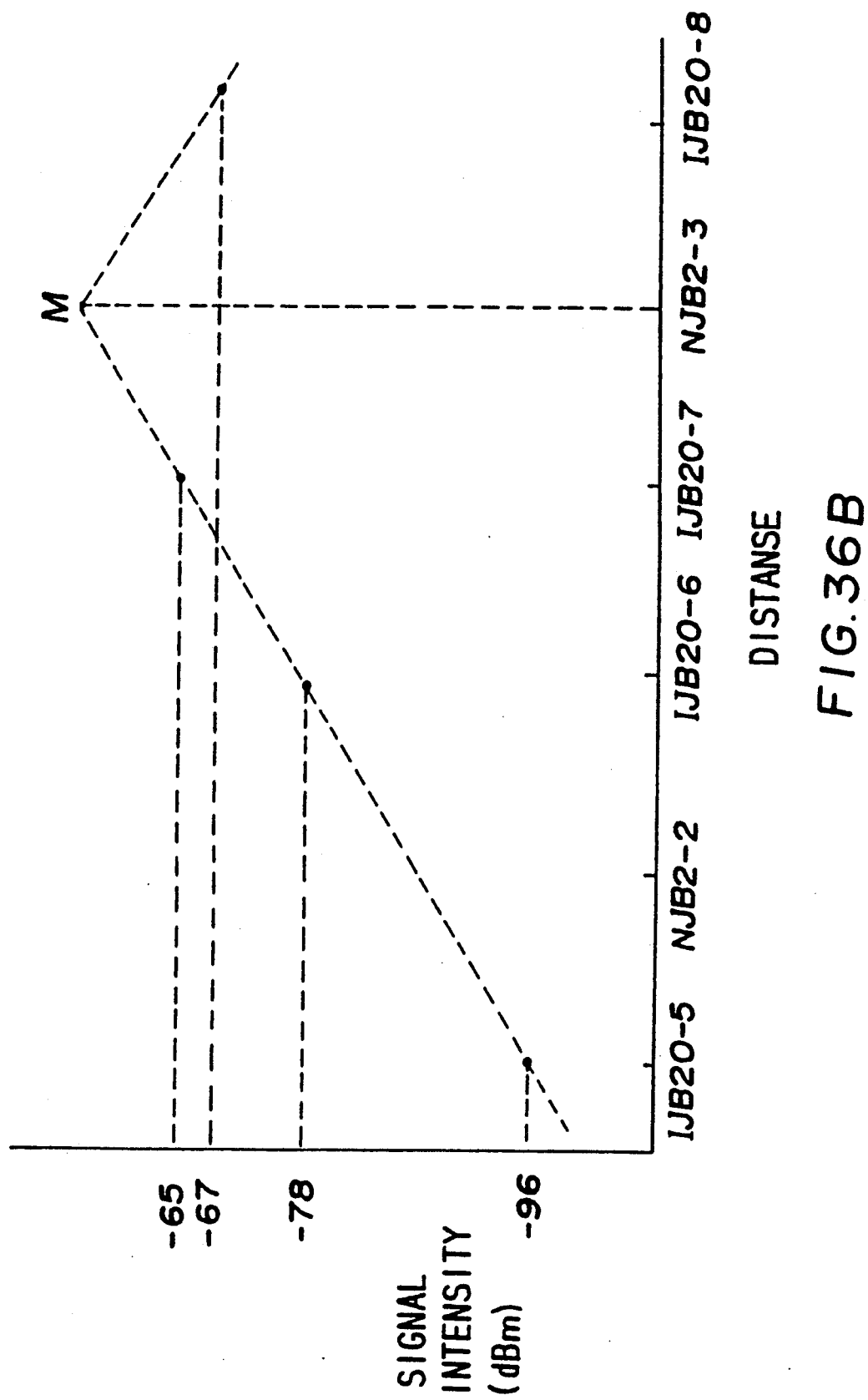

At each of the insulating joints, the detected results are obtained as shown in FIG. 36B, so that partial discharge occurs at the normal joint 2-3 corresponding the maximum value M in accordance with the same principle as in the seventeenth preferred embodiment.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A method for detecting partial discharge in a plastic solid insulation of an electric power cable, comprising:
    providing, externally of said cable, a lead wire connected to the ground and providing a magnetic core having a predetermined inductance around the lead wire;
    connecting said lead wire to said power cable through one of a terminal and a joint so that a high frequency pulse induced by said partial discharge flows through said lead wire;
    connecting a detecting lead wire in parallel to said lead wire so that said high frequency pulse is by-passed through said detecting lead wire; and
    detecting said high frequency pulse flowing through said detecting lead wire to diagnose a degradation of said insulation whereby detection of the partial discharge is carried out without interruption of operation of said cable.

2. A method for detecting partial discharge in a plastic solid insulation of an electric power cable, comprising:
    separating conductive member sections of said power cable, on which a high frequency pulse is induced by said partial discharge, by an insulation joint box;
    detecting said partial discharge by connecting a detecting impedance between two ends of said insulation joint box; said detecting impedance being connected to a partial discharge detecting apparatus, in which said partial discharge is detected to diagnose a degradation of said insulation; and
    connecting a calibration pulse generator in parallel with said detecting impedance to calibrate said partial discharge detecting apparatus.

3. A method for detecting partial discharge in a plastic solid insulation of an electric power cable, according to claim 2, wherein:

said conductive member sections each is a metal sheath of said electric power cable.

4. A method for detecting partial discharge in plastic solid insulation of an electric power cable, according to claim 3, further comprising:

providing a pair of detecting electrodes on a plastic anti-corrosion layer covering said separated metal sheaths, and connecting said electrodes to said detecting impedance.

5. A method for detecting partial discharge in a solid plastic insulation of an electric power cable, according to claim 4, further comprising:

providing a pair of calibrating electrodes on said plastic anti-corrosion layer adjacent to said pair of said detecting electrodes, and connecting said calibrating electrodes to said calibration pulse generator.

6. A method for detecting partial discharge in a plastic solid insulation of an electric power cable, comprising:

providing a detecting impedance connected to said cable;

detecting a frequency spectrum of noise obtained from said electric power cable;

providing a calibration signal generator and connecting said generator in parallel to said detecting impedance;

supplying a calibration pulse by said generator to said electric power cable;

detecting a frequency spectrum of an output signal obtained from said electric power cable, to which said calibration pulse is supplied;

comparing said frequency spectrums of said noise and said output signal to provide a frequency, at which a predetermined signal to noise ratio is obtained; and detecting said partial discharge of said electric power cable at said frequency.

7. A method for detecting partial discharge in a plastic solid insulation of an electric power cable, according to claim 6, wherein:

said calibration pulse is supplied between a conductor and a metal sheath of said electric power cable.

8. A method for detecting partial discharge in a plastic solid insulation of an electric power cable according to claim 7, wherein:

said calibration pulse is supplied to said electric power cable at an appropriate position which is selected from a terminal joint, an insulating joint, a normal joint and a longitudinally selected portion of said electric power cable.

* * * * *